(12) United States Patent
Uchino

(10) Patent No.: US 10,359,495 B2
(45) Date of Patent: Jul. 23, 2019

(54) OPEN-CIRCUIT VOLTAGE ESTIMATION DEVICE, POWER STORAGE APPARATUS, AND OPEN-CIRCUIT VOLTAGE ESTIMATION METHOD

(71) Applicant: Sony Corporation, Tokyo (JP)

(72) Inventor: Manabu Uchino, Kanagawa (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1072 days.

(21) Appl. No.: 14/509,617

(22) Filed: Oct. 8, 2014

(65) Prior Publication Data

US 2015/0112622 A1    Apr. 23, 2015

(30) Foreign Application Priority Data

Oct. 17, 2013  (JP) ................................ 2013-216454

(51) Int. Cl.
| | |
|---|---|
| *G06F 19/10* | (2011.01) |
| *G01R 35/00* | (2006.01) |
| *G01R 31/36* | (2019.01) |
| *G01R 19/00* | (2006.01) |
| *G01R 31/40* | (2014.01) |
| *G01R 31/3835* | (2019.01) |

(52) U.S. Cl.
CPC ....... *G01R 35/005* (2013.01); *G01R 19/0084* (2013.01); *G01R 31/3648* (2013.01); *G01R 31/3835* (2019.01); *G01R 31/40* (2013.01)

(58) Field of Classification Search
CPC ............ G01R 31/3624; G01R 31/3651; G01R 31/3675
USPC .............................. 702/64–65, 182–185, 188
See application file for complete search history.

(56) References Cited

U.S. PATENT DOCUMENTS 8,103,485 B2 *   1/2012  Plett ...................... H01M 10/48
                                                              320/137

FOREIGN PATENT DOCUMENTS

JP         2004-014231         1/2004

* cited by examiner

*Primary Examiner* — Edward Raymond
(74) *Attorney, Agent, or Firm* — K&L Gates LLP

(57) ABSTRACT

The present disclosure provides an open-circuit voltage estimation device that estimates a high-precision open-circuit voltage value, a power storage apparatus, and an open-circuit voltage estimation method. The open-circuit voltage estimation device includes: an open-circuit voltage calculator that calculates an open-circuit voltage value of a secondary cell; a polarization voltage estimator that estimates a component having a relatively large time constant among polarization voltage components of the secondary cell; and an open-circuit voltage corrector that corrects the open-circuit voltage value calculated by the open-circuit voltage calculator with the component having the relatively large time constant estimated by the polarization voltage estimator.

14 Claims, 21 Drawing Sheets

| TEMPERATURE [°C] | CURRENT [A] | SLOW POLARIZATION VOLTAGE COMPONENT [mv] |
|---|---|---|
| 10 | ... | ... |
| 20 | 0 | 0 |
| | 2 | 10 |
| | 4 | 20 |
| | ... | ... |
| 30 | 0 | 0 |
| | 2 | 7 |
| | 4 | 14 |
| | ... | ... |
| 40 | ... | ... |

FIG. 15

| STATE OF CHARGE 60% | | |
|---|---|---|
| TEMPERATURE [°C] | CURRENT [A] | SLOW POLARIZATION VOLTAGE COMPONENT [mv] |
| 10 | ... | ... |
| 20 | 0 | 0 |
| | 2 | 10 |
| | 4 | 20 |
| | ... | ... |
| 30 | 0 | 0 |
| | 2 | 7 |
| | 4 | 14 |
| | ... | ... |
| 40 | ... | ... |

⋮

| STATE OF CHARGE 50% | | |
|---|---|---|
| TEMPERATURE [°C] | CURRENT [A] | SLOW POLARIZATION VOLTAGE COMPONENT [mv] |
| 10 | ... | ... |
| 20 | 0 | ... |
| | 2 | ... |
| | 4 | ... |
| | ... | ... |
| 30 | 0 | ... |
| | 2 | ... |
| | 4 | ... |
| | ... | ... |
| 40 | ... | ... |

FIG. 19A

STATE OF CHARGE 60%

| TEMPERATURE [°C] | CURRENT [A] | SLOW POLARIZATION VOLTAGE COMPONENT [mv] |
|---|---|---|
| 10 | ... | ... |
| 20 | 0 | 0 |
|  | 2 | 10 |
|  | 4 | 20 |
| 30 | ... | ... |
|  | 0 | 0 |
|  | 2 | 7 |
|  | 4 | 14 |
| 40 | ... | ... |

FIG. 19B

STATE OF CHARGE 60%

| TEMPERATURE [°C] | CURRENT [A] | TIMING INFORMATION PERTAINING TO DIVISOR [sec] |
|---|---|---|
| 10 | ... | ... |
| 20 | 0 | 100 |
|  | 2 | 60 |
|  | 4 | 30 |
| 30 | ... | ... |
|  | 0 | 100 |
|  | 2 | 50 |
|  | 4 | 25 |
| 40 | ... | ... |

FIG. 24

| TEMPERATURE [°C] | CURRENT [A] | FIRST SLOW POLARIZATION VOLTAGE COMPONENT [mv] | SECOND SLOW POLARIZATION VOLTAGE COMPONENT [mv] |
|---|---|---|---|
| 10 | ... | ... | ... |
| 20 | 0 | 0 | ... |
|  | 2 | 10 | ... |
|  | 4 | 20 | ... |
|  | ... | ... | ... |
| 30 | 0 | 0 | ... |
|  | 2 | 7 | ... |
|  | 4 | 14 | ... |
|  | ... | ... | ... |
| 40 | ... | ... | ... |

OPEN-CIRCUIT VOLTAGE ESTIMATION DEVICE, POWER STORAGE APPARATUS, AND OPEN-CIRCUIT VOLTAGE ESTIMATION METHOD

CROSS REFERENCES TO RELATED APPLICATIONS

The present application claims priority to Japanese Priority Patent Application JP 2013-216454 filed in the Japan Patent Office on Oct. 17, 2013, the entire content of which is hereby incorporated by reference.

BACKGROUND

The present disclosure relates to an open-circuit voltage estimation device, a power storage apparatus, and an open-circuit voltage estimation method. More particularly, the present disclosure relates to an open-circuit voltage estimation device that estimates an open-circuit voltage value, a power storage apparatus, and an open-circuit voltage estimation method.

There have been techniques for estimating an open-circuit voltage (OCV) value of a secondary cell. For example, JP 2004-14231 A discloses a technique of estimating an open-circuit voltage with the use of an adaptive filter.

SUMMARY

Technical Problem

It is preferable to estimate an open-circuit voltage value with high precision.

The present disclosure provides an open-circuit voltage estimation device that estimates an open-circuit voltage value with high precision, a power storage apparatus, and an open-circuit voltage estimation method.

Solution to Problem

An open-circuit voltage estimation device according to the present disclosure includes: an open-circuit voltage calculator that calculates an open-circuit voltage value of a secondary cell; a polarization voltage estimator that estimates a component having a relatively large time constant among polarization voltage components of the secondary cell; and an open-circuit voltage corrector that corrects the open-circuit voltage value calculated by the open-circuit voltage calculator with the component having the relatively large time constant estimated by the polarization voltage estimator.

The polarization voltage estimator may include: an average calculator that calculates an average value of at least one of current and cell temperature of the secondary cell; and a polarization voltage calculator that calculates the component having the relatively large time constant based on the average value calculated by the average calculator.

In this case, the polarization voltage calculator may calculate the component having the relatively large time constant based on a table that is acquired beforehand and shows the correspondence relationship between the average value and the component having the relatively large time constant.

In this case, the table may show the correspondence relationship in accordance with the state of charge of the secondary cell, and the polarization voltage calculator may calculate the component having the relatively large time constant by referring to the correspondence relationship corresponding to the acquired state of charge. The polarization voltage estimator may include a divisor calculator that calculates the divisor to be used by the average calculator in calculating the average value. The polarization voltage calculator may calculate the component having the relatively large time constant by interpolating a value in the table.

The open-circuit voltage estimation device may further include a state-of-charge calculator that calculates the state of charge of the secondary cell based on the open-circuit voltage value corrected by the open-circuit voltage corrector, the state-of-charge calculator being connected to the open-circuit voltage estimation device.

The open-circuit voltage calculator may include a digital filter.

In the open-circuit voltage estimation device, the open-circuit voltage value corrected with the component having the relatively large time constant may be estimated based on terminal voltage information, current information, and cell temperature information about the secondary cell, the terminal voltage information, the current information, and the cell temperature information being acquired through communication.

A power storage apparatus according to the present disclosure includes a secondary cell, and an open-circuit voltage estimation device, wherein the open-circuit voltage estimation device includes: an open-circuit voltage calculator that calculates an open-circuit voltage value of a secondary cell; a polarization voltage estimator that estimates a component having a relatively large time constant among the polarization voltage components of the secondary cell; and an open-circuit voltage corrector that corrects the open-circuit voltage value calculated by the open-circuit voltage calculator with the component having the relatively large time constant estimated by the polarization voltage estimator.

An open-circuit voltage estimation method according to the present disclosure includes correcting a calculated open-circuit voltage value of a secondary cell with an estimated component having a relatively large time constant among the polarization voltage components of the secondary cell.

Advantageous Effects of Invention

According to the present disclosure, an open-circuit voltage value can be estimated with high precision.

Additional features and advantages are described herein, and will be apparent from the following Detailed Description and the figures.

BRIEF DESCRIPTION OF THE FIGURES

FIG. 3A is a timing chart showing current; and FIG. 3B is a timing chart showing a voltage relaxation process when the current flow is stopped;

FIG. 6A is a timing chart showing a case where correction is not performed with a component having a relatively large time constant; and FIG. 6B is a timing chart showing a case where correction is performed with a component having a relatively large time constant;

FIG. 15 is a schematic diagram for explaining the example structure of the power storage apparatus according to the second modification of the second embodiment of the present disclosure, showing tables that show the correspondence relationship among cell temperature, current, and a component having a relatively large time constant, and vary with states of charge;

FIG. 16A is a graph showing the correspondence relationship among current, the state of charge, and a component having a relatively large time constant; and FIG. 16B is a graph showing the correspondence relationship among cell temperature, the state of charge, and a component having a relatively large time constant;

FIGS. 19A and 19B are graphs for explaining the example structure of the power storage apparatus according to the third modification of the second embodiment of the present disclosure: FIG. 19A is a graph showing the correspondence relationship among cell temperature, current, and a component having a relatively large time constant; and FIG. 19B is a graph showing the correspondence relationship among cell temperature, current, and timing information for calculating a divisor;

FIG. 24 is a schematic diagram for explaining the example structure of the power storage apparatus according to the fourth modification of the second embodiment of the present disclosure, showing a table that shows the correspondence relationship among cell temperature, current, and a component having a relatively large time constant;

DETAILED DESCRIPTION

Figure 1:
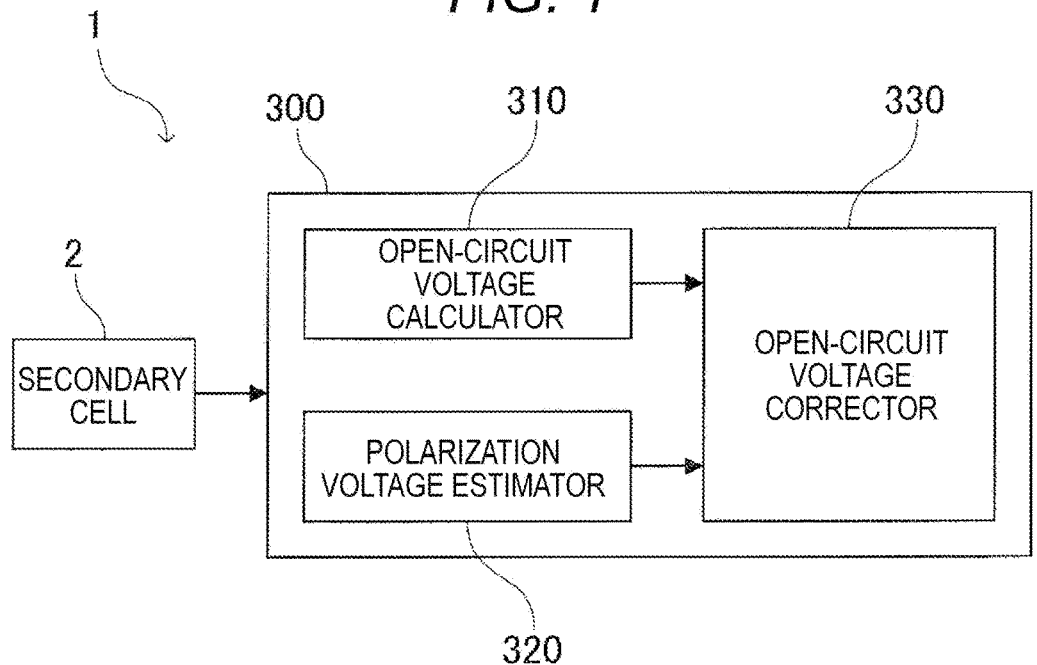
FIG. 1 is a diagram schematically showing an example structure of a power storage apparatus according to a first embodiment of the present disclosure.

The following is a description of preferred embodiments for carrying out the present disclosure, with reference to the accompanying drawings. The embodiments described below are typical examples of embodiments of the present disclosure, and do not narrow the interpretation of the scope of the present disclosure. In the respective embodiments, corresponding components are denoted by same reference numerals, and explanation of them will not be repeated more than once. Explanation will be made in the following order.

1. First embodiment
(An example of a power storage apparatus that corrects an open-circuit voltage value with a component having a relatively large time constant)
2. First modification of the first embodiment
(An example of a power storage apparatus that calculates a state of charge based on an open-circuit voltage value)
3. Second embodiment
(An example of a power storage apparatus that calculates a component having a relatively large time constant by using average values of current and cell temperature)
4. First modification of the second embodiment
(An example of a power storage apparatus that calculates a component having a relatively large time constant by referring to a table)
5. Second modification of the second embodiment
(An example of a power storage apparatus that calculates a component having a relatively large time constant by referring to a table that takes a state of charge into account)
6. Third modification of the second embodiment
(An example of a power storage apparatus that calculates the divisor for calculating average values of current and cell temperature)
7. Fourth modification of the second embodiment
(An example of a power storage apparatus that calculates more than one component having a relatively large time constant)
8. Third embodiment
(An example of a power storage apparatus that calculates a component having a relatively large time constant by interpolating a value in a table)
9. Fourth embodiment
(An example of a power storage apparatus that calculates an open-circuit voltage value with a digital filter)
10. First modification of the fourth embodiment
(An example of a power storage apparatus that calculates an open-circuit voltage value with an adaptive filter)
11. Fifth embodiment
(An example of a power storage apparatus that calculates a component having a relatively large time constant based on secondary cell information acquired through communication)
12. First modification of the fifth embodiment
(An example of a power storage apparatus that transmits secondary cell information to an open-circuit voltage estimation device)

1. First Embodiment

[Example Structure of a Device]

FIG. 1 is a diagram schematically showing an example structure of a power storage apparatus 1 of this embodiment. As shown in FIG. 1, the power storage apparatus 1 includes a secondary cell 2 and an open-circuit voltage estimation device 300 as an example of an open-circuit voltage estimation device according to the present disclosure.

[Secondary Cell 2]

The secondary cell 2 can be charged and discharged. At a time of charge, the secondary cell 2 stores a charging current supplied from a charger (not shown) as charges. At a time of discharge, the secondary cell 2 can supply stored charges as a discharging current to a load (not shown). The number of secondary cells 2 and the form of connection of the secondary cells 2 are not particularly limited.

Figure 2:
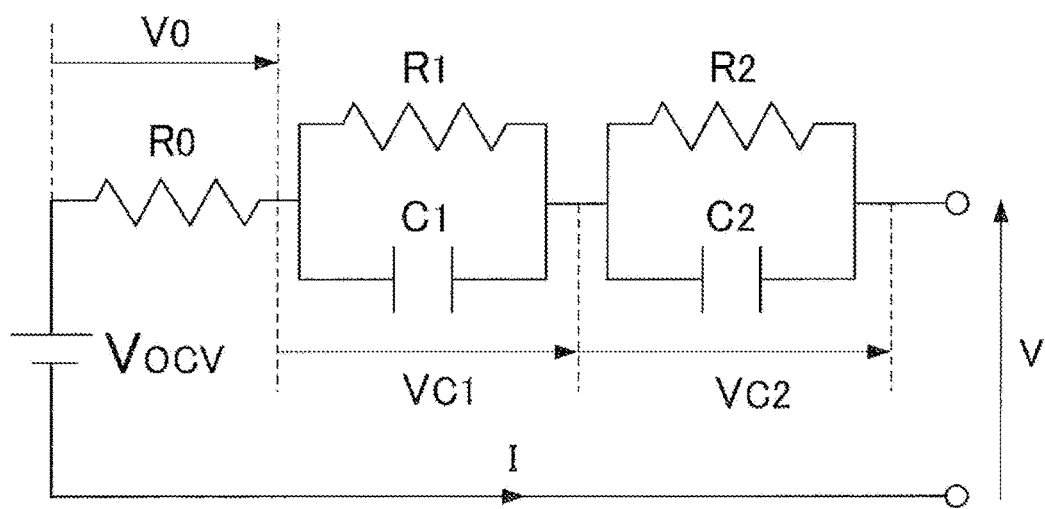
FIG. 2 is an equivalent circuit diagram of a secondary cell for explaining the example structure of the power storage apparatus according to the first embodiment of the present disclosure.

The secondary cell 2 has an ohmic resistance deriving from a bulk resistance of an electrolytic solution, for example, or a resistance based on the Ohm's law. The secondary cell 2 also has a polarization voltage deriving from the concentration polarization of ions generated in an electrode interface or solid matter, for example. Therefore, the secondary cell 2 can be represented by an equivalent circuit shown in FIG. 2. As shown in FIG. 2, the equivalent circuit includes a resistance $R_0$ representing the ohmic resistance component, parallel circuits that are formed with resistances $R_1$ and $R_2$ and capacitors $C_1$ and $C_2$ and represent the polarization voltage, and an open-circuit voltage $V_{OCV}$. As shown in FIG. 2, the polarization voltage of the secondary cell 2 can be divided into and represented by components $V_{C1}$ and $V_{C2}$ of the respective parallel circuits. The structure of the equivalent circuit can be changed in accordance with the form of the secondary cell 2. For example, the number of the RC parallel circuits is not limited to as two as shown in FIG. 2, but may be three or more.

Figure 3B:
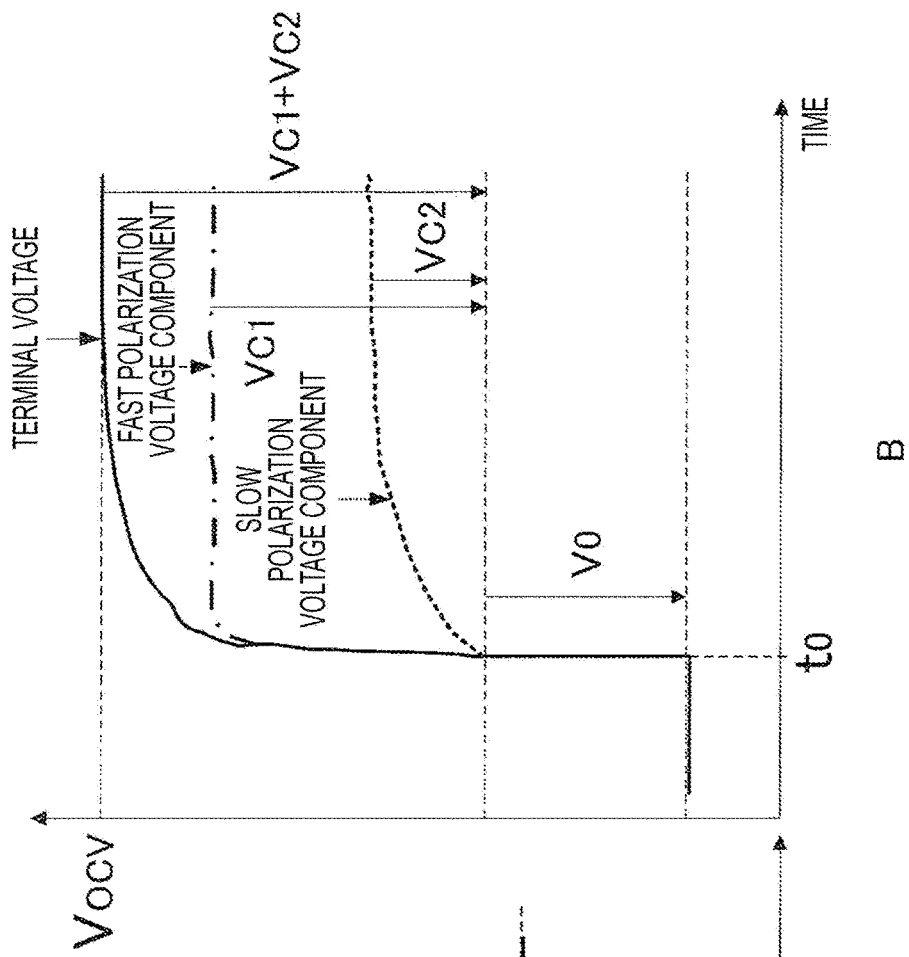
FIGS. 3A and 3B are timing charts illustrating the characteristics of a secondary cell for explaining the example structure of the power storage apparatus according to the first embodiment of the present disclosure.
Figure 3A:
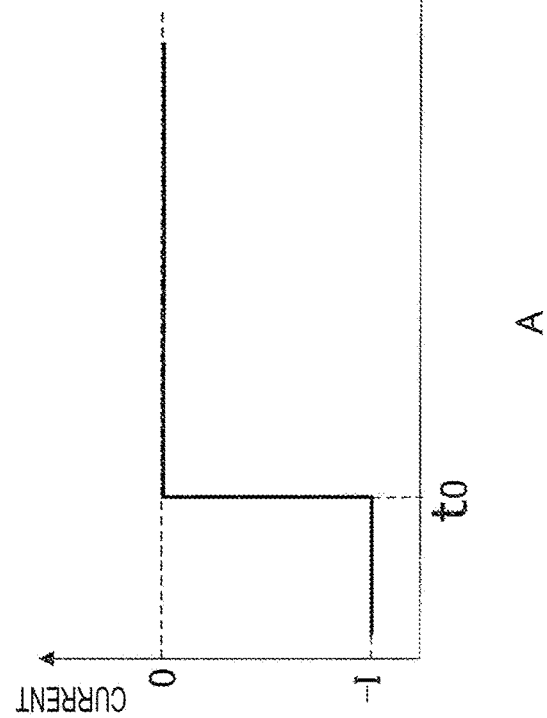

FIG. 3B shows a voltage relaxation process when current is stopped in the secondary cell 2. As shown in FIG. 3A, this voltage relaxation process corresponds to a case where constant current discharge is performed with a current I [A] in the initial stage, and the current is stopped at time $t_0$. As shown in FIG. 3B, the terminal voltage $V_{C1}+V_{C2}$ of the secondary cell 2 converges to the open-circuit voltage value $V_{OCV}$ through the polarization voltage relaxation process from time $t_0$ when the discharge is stopped.

As a result of an intensity study, it has become apparent that the polarization voltage relaxation process can be divided into a component $V_{C1}$ having a relatively high response speed (hereinafter referred to as the fast polarization voltage component) and a component $V_{C2}$ having a relatively low response speed (hereinafter referred to as the slow polarization voltage component), as shown in FIG. 3B. It has also become apparent that the slow polarization voltage component depends on the current, the temperature, and the state of charge (SOC) of the secondary cell, and causes the open-circuit voltage value to greatly vary with temperatures and loads. The present disclosure is focused on the slow polarization voltage component, and is to sufficiently reduce the estimate error of the open-circuit voltage value even in an environment where the temperature and the load vary greatly.

Figure 4:
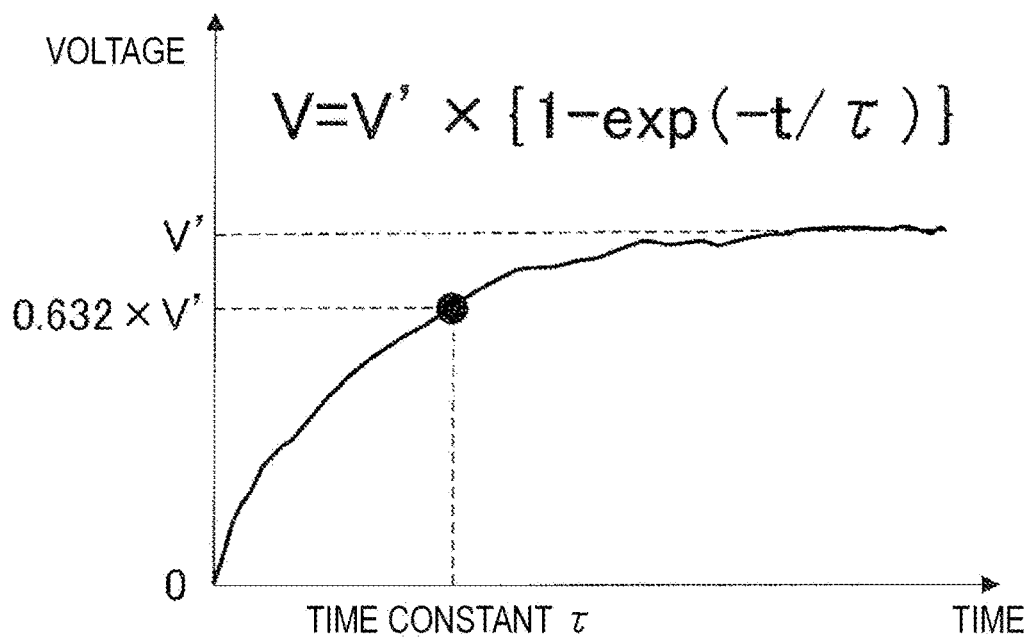
FIG. 4 is a timing chart for explaining the example structure of the power storage apparatus according to the first embodiment of the present disclosure, showing the relationship between a polarization voltage relaxation process in a secondary cell and time constant.

FIG. 4 shows the relationship between the polarization voltage relaxation process and the time constant in the secondary cell 2. As represented by the RC parallel circuits in the equivalent circuit shown in FIG. 2, the polarization voltage relaxation process can be expressed as an exponential function of a natural number (e). The time constant τ in FIG. 4 is often used as an indicator of a convergence speed of a voltage $V=V'\times\{1-\exp(-t/\tau)\}$. The time constant τ becomes smaller as current becomes larger and cell temperature becomes higher. Therefore, the time constant τ is smaller when current is flowing than when current is not flowing.

The fast polarization voltage component $V_{C1}$ shown in FIGS. 3A and 3B is a component having a relatively small time constant τ, and the slow polarization voltage component $V_{C2}$ is a component having a relatively large time constant τ. A slow polarization voltage component has a large time constant and does not respond promptly to changes in the voltage of the secondary cell 2. Therefore, it is considered that a slow polarization voltage component causes an error in estimation of an open-circuit voltage value. In the example illustrated in FIG. 2, the time constant of the fast polarization voltage component $V_{C1}$ is $R_1C_1$, and the time constant of the slow polarization voltage component $V_{C2}$ is $R_2C_2$.

The secondary cell 2 is not limited to any particular form. For example, the secondary cell 2 may be a lithium-ion secondary cell having lithium iron phosphate (LiFePO$_4$) as the cathode material. This type of cell is known as a high-security cell. However, a change in the open-circuit voltage value with respect to a state of charge has small characteristics, and therefore, an increase in accuracy of open-circuit voltage value estimation is of significance. It should be noted that the present disclosure does not exclude applications to secondary cells other than lithium-ion secondary cells, such as nickel-metal hydride cells.

[Open-Circuit Voltage Estimation Device 300]

As shown in FIG. 1, the open-circuit voltage estimation device 300 includes an open-circuit voltage calculator 310, a polarization voltage estimator 320, and an open-circuit voltage corrector 330.

[Open-Circuit Voltage Calculator 310]

The open-circuit voltage calculator 310 is designed to calculate the open-circuit voltage value of the secondary cell 2. The open-circuit voltage calculator 310 is also designed to output the calculated open-circuit voltage value to the open-circuit voltage corrector 330.

The method used by the open-circuit voltage calculator 310 to calculate an open-circuit voltage value is not particularly limited. For example, the open-circuit voltage calculator 310 may be designed to calculate an open-circuit voltage value based on input data that is the results of measurement of the terminal voltage, the current, and the temperature of the secondary cell 2. In this case, the terminal voltage of the secondary cell 2 may be measured with a voltmeter connected to the secondary cell 2. The current in the secondary cell 2 may be measured with an ammeter connected to the secondary cell 2. The temperature of the secondary cell 2 may be measured with a thermometer connected to the secondary cell 2.

In a case where the power storage apparatus 1 is designed to calculate the state of charge of the secondary cell 2, the open-circuit voltage calculator 310 may receive an input of the calculated state of charge of the secondary cell 2, and use the input state of charge in calculating an open-circuit voltage value. In this case, the state of charge is preferably the latest value. However, if the reliability of the calculated value of the state of charge is considered to be low, the state of charge may not be used in calculating an open-circuit voltage value.

The open-circuit voltage calculator 310 is not limited to any particular form. For example, the open-circuit voltage calculator 310 may be formed with an electronic device or the like. The electronic device may include an arithmetic processing unit such as a CPU (Central Processing Unit) or an MPU (Micro-Processing Unit), and storage units such as a RAM (Random Access Memory) and a ROM (Read Only Memory). The ROM may store the program and data for realizing the functions of the open-circuit voltage calculator 310. The arithmetic processing unit may execute the program stored in the ROM to realize the functions of the open-circuit voltage calculator 310. The RAM may be used as the work area of the arithmetic processing unit or the like. The open-circuit voltage calculator 310 may include a DSP (Digital Signal Processor).

[Polarization Voltage Estimator 320]

The polarization voltage estimator 320 is designed to estimate the component having the largest time constant τ among the polarization voltage components of the secondary cell 2. That is, the polarization voltage estimator 320 is designed to estimate the largest value of the slow polarization voltage component. The polarization voltage estimator 320 is also designed to output the estimated slow polarization voltage component to the open-circuit voltage corrector 330.

The slow polarization voltage component can also be obtained by dividing the voltage relaxation process at a time of a current stop as shown in FIGS. 3A and 3B into a fast polarization voltage component and a slow polarization voltage component by fitting or the like.

The slow polarization voltage component is not limited to one polarization voltage component. Where there are three or more polarization voltage components, for example, the polarization voltage component having the largest time constant may be regarded as the slow polarization voltage component, or the polarization voltage components having the two or more largest ones of time constants may be regarded as the slow polarization voltage components.

The slow polarization voltage component may also be the polarization voltage component having a larger time constant than the time length of the input data to be used in one open-circuit voltage value calculation. In that case, the time length of the input data may be the product of an input period or a sampling period of the input data and the number of pieces or the number of samples in the input data.

The polarization voltage estimator 320 is not limited to any particular form. For example, the polarization voltage estimator 320 may be formed with an electronic device or the like. The electronic device may include an arithmetic processing unit such as a CPU or an MPU, and storage units such as a RAM and a ROM. The ROM may store the program and data for realizing the functions of the polarization voltage estimator 320. The arithmetic processing unit may execute the program stored in the ROM to realize the functions of the polarization voltage estimator 320. The RAM may be used as the work area of the arithmetic processing unit or the like. The polarization voltage estimator 320 may share part of the hardware with the open-circuit voltage calculator 310, or may be a structure that is completely independent of the open-circuit voltage calculator 310.

[Open-Circuit Voltage Corrector 330]

The open-circuit voltage corrector 330 is designed to correct the open-circuit voltage value calculated by the open-circuit voltage calculator 310 with the largest value of the slow polarization voltage component estimated by the polarization voltage estimator 320 (hereinafter referred to simply as the slow polarization voltage component).

In a case where the amount of discharge is larger than the amount of charge in the secondary cell 2, or in the case of overdischarge, the open-circuit voltage corrector 330 may add the slow polarization voltage component estimated by the polarization voltage estimator 320 to the open-circuit voltage value calculated by the open-circuit voltage calculator 310. In a case where the amount of charge is larger than the amount of discharge in the secondary cell 2, or in the case of overcharge, open-circuit voltage corrector 330 may subtract the slow polarization voltage component estimated by the polarization voltage estimator 320 from the open-circuit voltage value calculated by the open-circuit voltage calculator 310. The open-circuit voltage values in such cases can be represented by the following expressions (1).

$$V_{OCV}=V'_{OCV}-\Delta V_{diff\text{-}L}, I \geq 0 \text{ (overcharge)}$$

$$V_{OCV}=V'_{OCV}+\Delta V_{diff\text{-}L}, I < 0 \text{ (overdischarge)} \quad \text{[Mathematical Formula 1]}$$

In the expressions (1), $V_{OCV}$ represents the open-circuit voltage value after correction. $V'_{OCV}$ represents the open-circuit voltage value prior to correction. $\Delta V_{diff\text{-}L}$ represents the slow polarization voltage component. I represents current.

The open-circuit voltage corrector 330 is not limited to any particular form. For example, the open-circuit voltage corrector 330 may be formed with an electronic device or the like. The electronic device may include an arithmetic processing unit such as a CPU or an MPU, and storage units such as a RAM and a ROM. The ROM may store the program and data for realizing the functions of the open-circuit voltage corrector 330. The arithmetic processing unit may execute the program stored in the ROM to realize the functions of the open-circuit voltage corrector 330. The RAM may be used as the work area of the arithmetic processing unit or the like. The open-circuit voltage corrector 330 may share part of the hardware with the open-circuit voltage calculator 310 and the polarization voltage estimator 320, or may be a completely independent structure.

[Example Operation of the Device]

Figure 5:
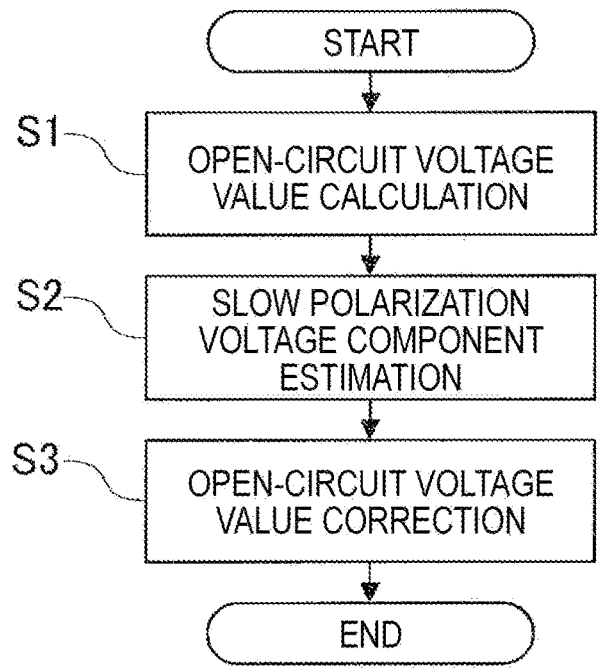
FIG. 5 is a flowchart showing an example operation of the power storage apparatus according to the first embodiment of the present disclosure.

FIG. 5 is a flowchart showing an example operation of the power storage apparatus 1 of this embodiment. The example operation shown in FIG. 5 includes an embodiment of an open-circuit voltage estimation method according to the present disclosure. However, an open-circuit voltage estimation method according to the present disclosure may be embodied with a structure other than the power storage apparatus 1.

First, in step 1 (S1) in FIG. 5, the open-circuit voltage calculator 310 calculates an open-circuit voltage value.

In step 2 (S2), the polarization voltage estimator 320 estimates a slow polarization voltage component. Step 2 (S2) may be carried out before step 1 (S1), or may be carried out at the same time as step 1 (S1).

Figure 6B:
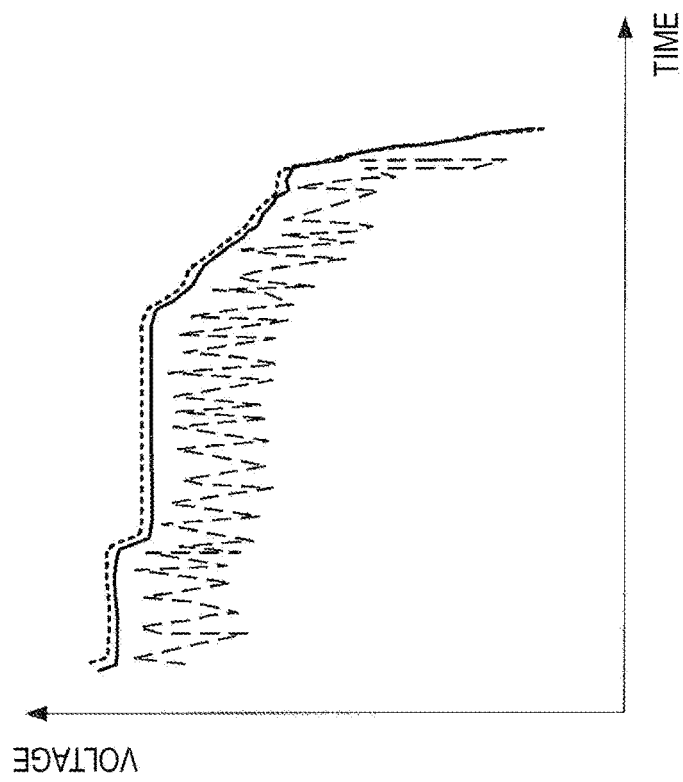
FIGS. 6A and 6B are timing charts for explaining the example operation of the power storage apparatus according to the first embodiment of the present disclosure.
Figure 6A:
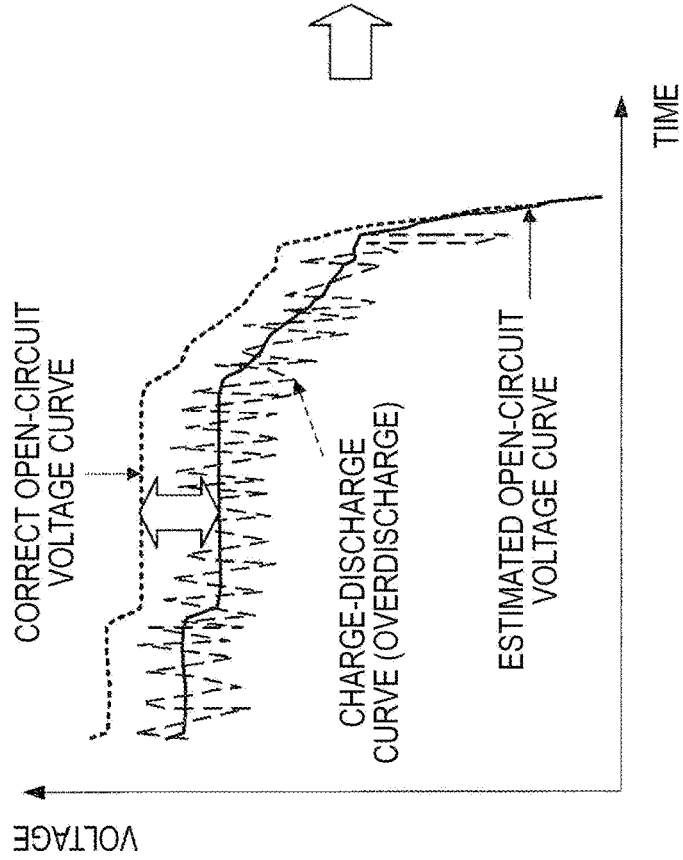

In step 3 (S3), the open-circuit voltage corrector 330 corrects the open-circuit voltage value calculated in step 1 (S1) with the slow polarization voltage component estimated in step 2 (S2). For example, as indicated by the estimated open-circuit voltage curve in FIG. 6A, the open-circuit voltage calculated in step 1 (S1) is assumed to be lower than the true value of the open-circuit voltage value represented by the correct open-circuit voltage value curve shown in FIG. 6A due to overdischarge. FIG. 6A shows a charge-discharge curve indicating overdischarge. In this case, the open-circuit voltage value is upwardly revised with the slow polarization voltage component estimated in step 2 (S2) to a value that is the same or close to the true value of the open-circuit voltage value, as shown in FIG. 6B.

In the power storage apparatus 1 of this embodiment, an open-circuit voltage value can be estimated with high precision even in an environment where temperature and load vary greatly, with the slow polarization voltage component being taken into account. Also, in the power storage apparatus 1 of this embodiment, an open-circuit voltage value can be estimated with high precision in an actually used state or at a time of charge/discharge. High-precision estimation of an open-circuit voltage value leads to high-precision sensing of a state of charge, and accordingly, high reliability of the sensed state of charge of the secondary cell 2 can be secured. As for deterioration of the secondary cell 2, high-precision estimation can be expected, where a curve drawn with an open-circuit voltage value and a current integrated quantity Q is used, and contraction and shifting of the curve are observed.

2. First Modification of the First Embodiment

Figure 7:
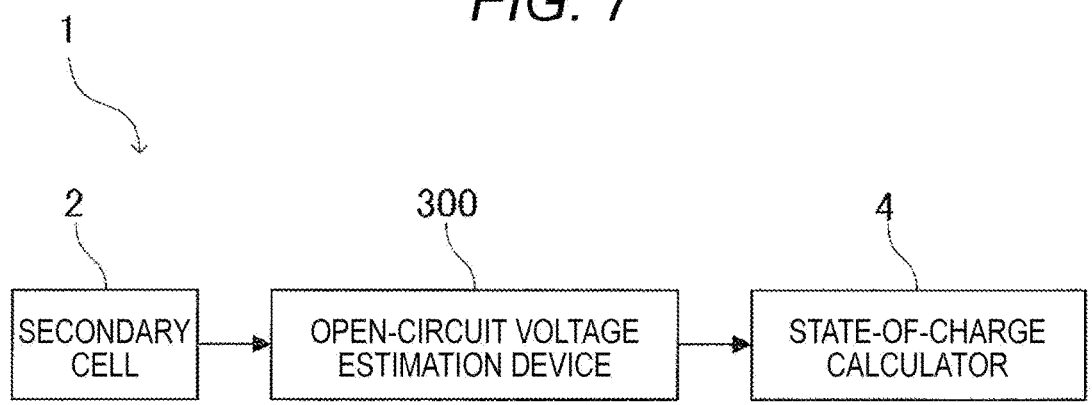
FIG. 7 is a diagram schematically showing an example structure of a power storage apparatus according to a first modification of the first embodiment of the present disclosure.

FIG. 7 is a diagram schematically showing an example structure of a power storage apparatus 1 according to a first modification of this embodiment. The power storage apparatus 1 of this modification differs from the power storage apparatus 1 of FIG. 1 in calculating a state of charge.

Specifically, as shown in FIG. 7, the power storage apparatus 1 of this modification includes a state-of-charge calculator 4 connected to an open-circuit voltage estimation device 300. The state-of-charge calculator 4 is in a stage after the open-circuit voltage estimation device 300. The state-of-charge calculator 4 is designed to receive the data of an open-circuit voltage value estimated by the open-circuit voltage estimation device 300 or an open-circuit voltage value corrected by the open-circuit voltage corrector 330. The state-of-charge calculator 4 is designed to calculate the state of charge of the secondary cell 2 based on the open-circuit voltage value that has been input.

Figure 8:
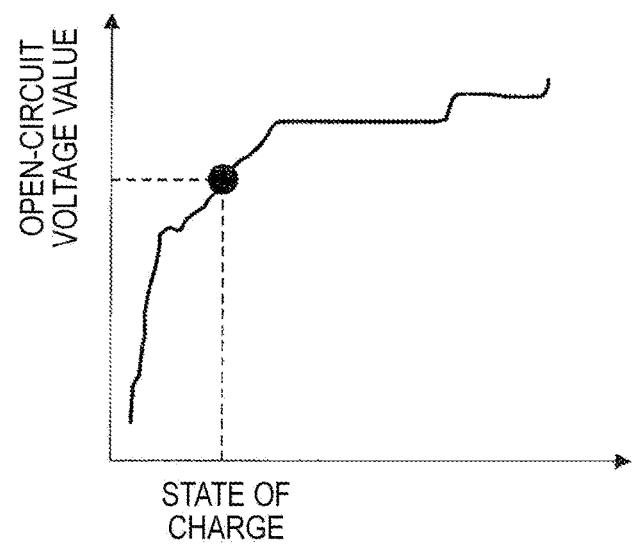
FIG. 8 is a graph for explaining the example structure of the power storage apparatus according to the first modification of the first embodiment of the present disclosure, showing the correspondence relationship between the state of charge and the open-circuit voltage value.

The method of calculating a state of charge is not limited to any particular method. For example, the state-of-charge calculator 4 may uniquely calculate a state of charge based on data that shows the correspondence relationship between the open-circuit voltage value and the state of charge as shown in FIG. 8. The data showing the correspondence relationship as in FIG. 8 may be pointwise data shown in a table, for example.

The state-of-charge calculator 4 is not limited to any particular form. For example, the state-of-charge calculator 4 may be formed with an electronic device or the like. The electronic device may include an arithmetic processing unit such as a CPU or an MPU, and storage units such as a RAM and a ROM. The ROM may store the program and data for realizing the functions of the state-of-charge calculator 4. The arithmetic processing unit may execute the program stored in the ROM to realize the functions of the state-of-charge calculator 4. The RAM may be used as the work area of the arithmetic processing unit or the like. The state-of-charge calculator 4 may share part of the hardware with the open-circuit voltage estimation device 300, or may be a structure that is completely independent of the open-circuit voltage estimation device 300.

[Example Operation of the Device]

Figure 9:
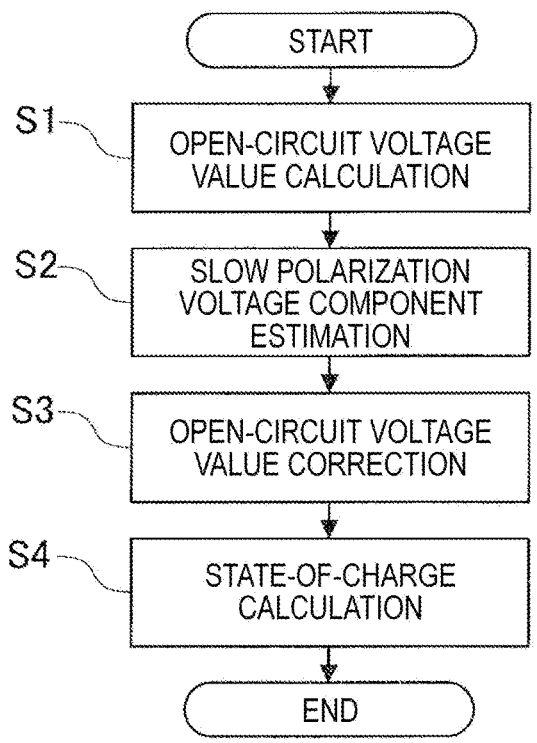
FIG. 9 is a flowchart showing an example operation of the power storage apparatus according to the first modification of the first embodiment of the present disclosure.

FIG. 9 is a flowchart showing an example operation of the power storage apparatus 1 of this modification. The example operation shown in FIG. 9 includes an embodiment of an open-circuit voltage estimation method according to the present disclosure.

In this modification, step 4 (S4) is carried out after step 3 (S3) shown in FIG. 5. Specifically, in step 4 (S4), the state-of-charge calculator 4 calculates the state of charge based on the open-circuit voltage value corrected in step 3 (S3).

According to this modification, the same effects as those of the power storage apparatus 1 shown in FIG. 1 can be achieved, and a state of charge can be calculated with high precision.

3. Second Embodiment

[Example Structure of a Device]

Figure 10:
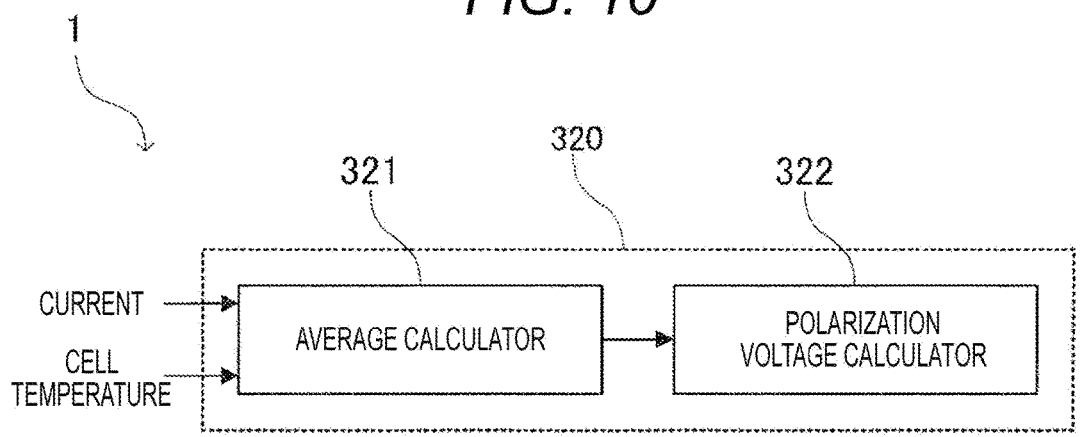
FIG. 10 is a diagram schematically showing an example structure of a power storage apparatus according to a second embodiment of the present disclosure.

FIG. 10 is a diagram schematically showing an example structure of a power storage apparatus 1 of this embodiment.

The power storage apparatus 1 of this embodiment differs from the power storage apparatus 1 of FIG. 1 in the structure of the polarization voltage estimator 320. This aspect will be described below in detail.

[Polarization Voltage Estimator 320]

As shown in FIG. 10, the polarization voltage estimator 320 of this embodiment includes an average calculator 321 and a polarization voltage calculator 322.

[Average Calculator 321]

The average calculator 321 is designed to receive, from the side of the secondary cell 2, an input of at least one measured value of the current and the temperature of the secondary cell 2. The average calculator 321 is designed to calculate the average value(s) of the current and/or the temperature of the secondary cell 2 based on the input measured value(s). The average calculator 321 is also designed to output the calculated average value(s) to the polarization voltage calculator 322. The average value(s) is (are) not limited to any particular form(s). For example, the average value(s) may be the arithmetic average value(s) or the like of a predetermined number of inputs or a predetermined number of samples of measured values of the current and/or the temperature, but is (are) not limited to that (them).

[Polarization Voltage Calculator 322]

The polarization voltage calculator 322 is designed to calculate a slow polarization voltage component based on the average value(s) input from the average calculator 321.

The method of calculating a slow polarization voltage component based on the average value(s) is not limited to any particular method. For example, the polarization voltage calculator 322 may calculate the slow polarization voltage component by putting the average value(s) into an already acquired correspondence relationship between the slow polarization voltage component and the current and/or the temperature of the secondary cell 2. The correspondence relationship may also involve the state of charge.

[Example Operation of the Device]

Figures 11, 12:
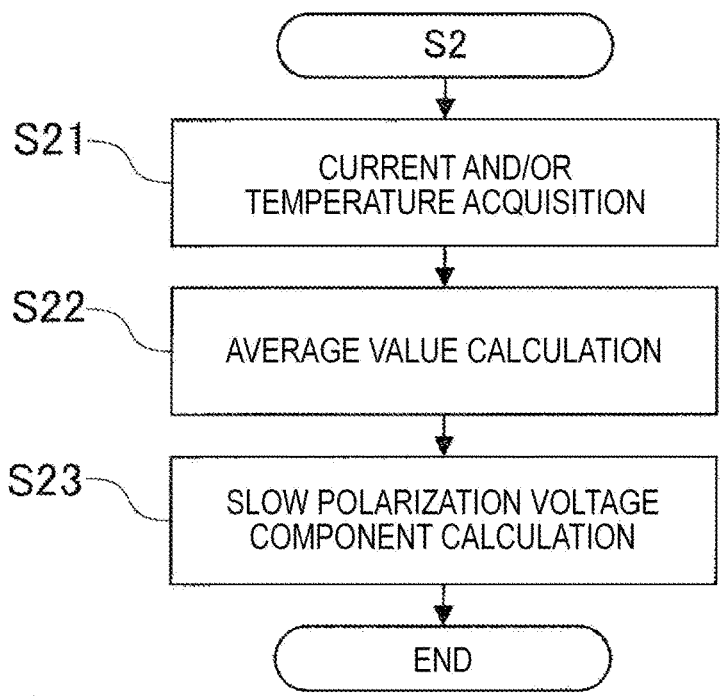
FIG. 11 is a flowchart showing an example operation of the power storage apparatus according to the second embodiment of the present disclosure.
FIG. 12 is a schematic diagram for explaining an example structure of a power storage apparatus according to a first modification of the second embodiment of the present disclosure, showing a table that shows the correspondence relationship among cell temperature, current, and a component having a relatively large time constant.

FIG. 11 is a flowchart showing an example operation of the power storage apparatus 1 of this embodiment. The example operation shown in FIG. 11 includes an embodiment of an open-circuit voltage estimation method according to the present disclosure.

In this embodiment, a series of procedures of steps 21 (S21) through 23 (S23) are carried out as a specific example of step 2 (S2) of FIG. 5.

Specifically, in step 21 (S21), the average calculator 321 acquires the current and/or the temperature of the secondary cell 2.

In step 22 (S22), the average calculator 321 calculates the average value(s) of the current and/or the temperature of the secondary cell 2 acquired in step 21 (S21).

In step 23 (S23), the polarization voltage calculator 322 calculates the slow polarization voltage component based on the average value(s) calculated in step 22 (S22).

With the power storage apparatus 1 of this embodiment, the same effects as those of the power storage apparatus 1 of FIG. 1 can be achieved, and the calculation of the slow polarization voltage component that depends on the current and the temperature of the secondary cell 2 can be simplified by using the average value(s).

4. First Modification of the Second Embodiment

[Example Structure of a Device]

A power storage apparatus 1 of this modification differs from the power storage apparatus 1 of FIG. 10 in the structure of the polarization voltage calculator 322.

[Table]

Specifically, the polarization voltage calculator 322 of this modification is designed to calculate the slow polarization voltage component based on a table that is acquired beforehand and shows the correspondence relationship between average values and the slow polarization voltage component as shown in FIG. 12, for example. The table may be stored in the storage area of the polarization voltage calculator 322, but is not limited to this arrangement.

[Example Operation of the Device]

Figure 13:
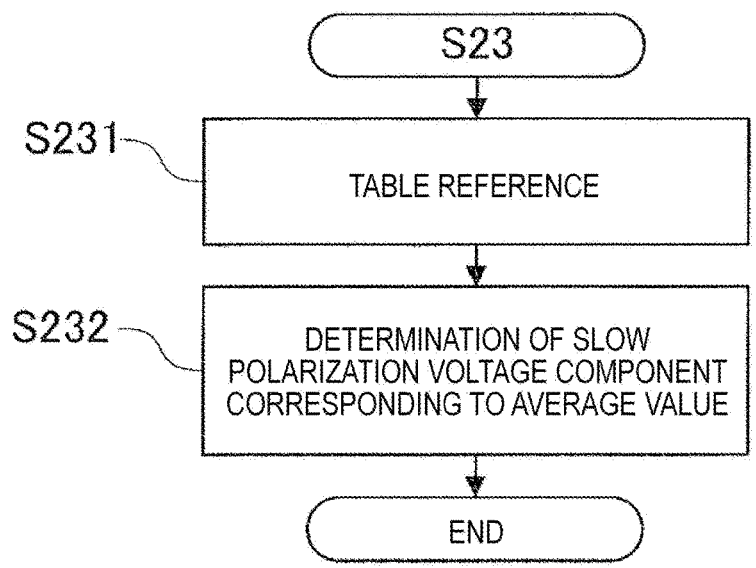
FIG. 13 is a flowchart showing an example operation of the power storage apparatus according to the first modification of the second embodiment of the present disclosure.

FIG. 13 is a flowchart showing an example operation of the power storage apparatus 1 of this modification. The example operation shown in FIG. 13 includes an embodiment of an open-circuit voltage estimation method according to the present disclosure.

In this modification, a series of procedures of steps 231 (S231) and 232 (S232) are carried out as a specific example of step 23 (S23) of FIG. 11.

Specifically, in step 231 (S231), the polarization voltage calculator 322 refers to the table.

In step 232 (S232), the polarization voltage calculator 322 unambiguously identifies the slow polarization voltage component corresponding to the average value(s) calculated in step 22 (S22) of FIG. 11 from the table, and sets the identified slow polarization voltage component as the calculation result.

With the power storage apparatus 1 of this modification, the same effects as those of the power storage apparatus 1 of FIG. 10 can be achieved, and the slow polarization voltage component can be readily and quickly calculated with a small operational load and low power consumption.

5. Second Modification of the Second Embodiment

[Example Structure of a Device]

A power storage apparatus 1 of this modification differs from the power storage apparatus 1 described with reference to FIG. 12 in the structure of the polarization voltage estimator 320.

Figure 14:
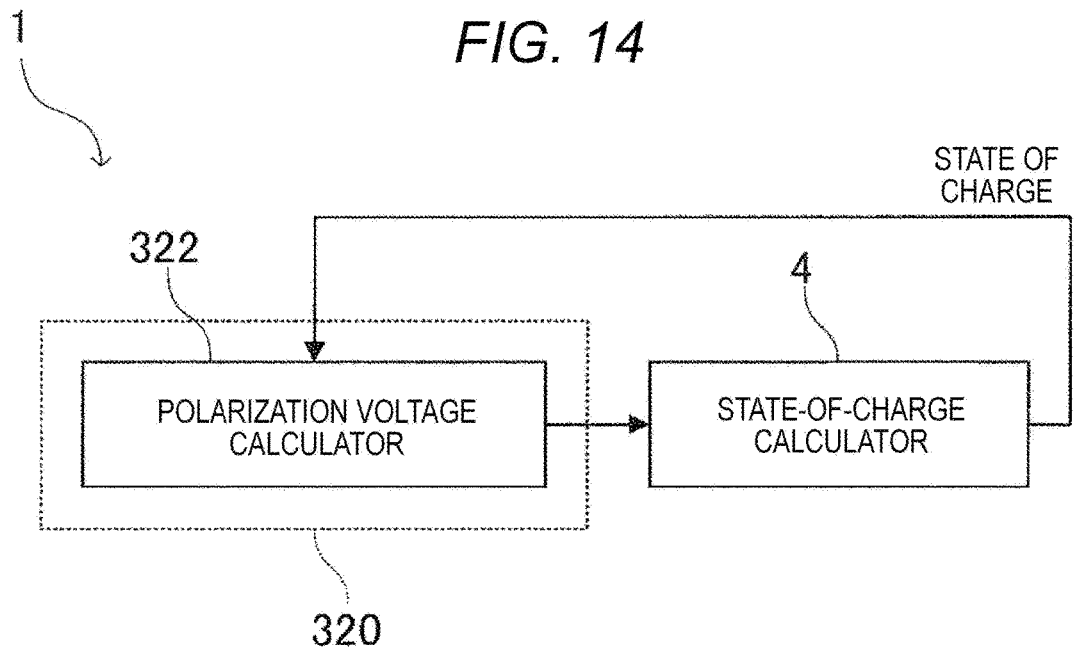
FIG. 14 is a diagram schematically showing an example structure of a power storage apparatus according to a second modification of the second embodiment of the present disclosure.

Specifically, as shown in FIG. 14, the data of the last or the latest state of charge calculated by the state-of-charge calculator 4 is input to or fed back to the polarization voltage calculator 322. The polarization voltage calculator 322 is designed to calculate a slow polarization voltage component by referring to the correspondence relationship in the table in accordance with the state of charge acquired from the state-of-charge calculator 4 or the correspondence relationship between the slow polarization voltage component and the current and/or the temperature of the secondary cell 2.

The table shows the correspondence relationship between the slow polarization voltage component and the current and/or the temperature of the secondary cell 2 in relation to the state of charge. The table is not limited to any particular form. For example, a different table may be prepared and stored for each state of charge, as shown in FIG. 15.

Figure 16A:
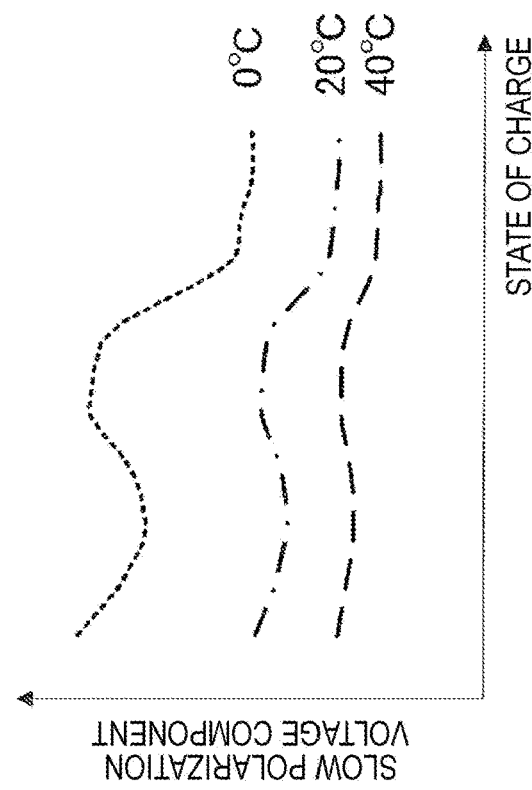
FIGS. 16A and 16B are graphs for explaining an example structure of the power storage apparatus according to the second embodiment of the present disclosure.
Figure 16B:
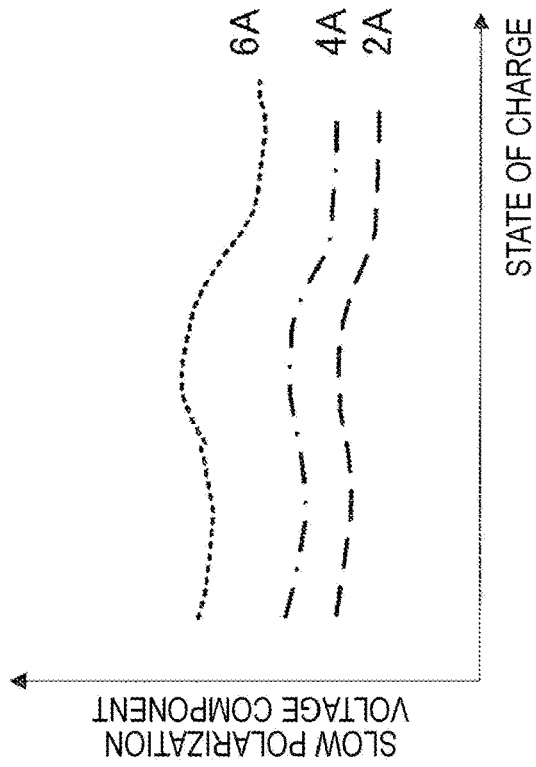

As can be seen from FIG. 16A, it has been discovered that the slow polarization voltage component characteristically depends on the current and the state of charge. As can be seen from FIG. 16B, it has been discovered that the slow polarization voltage component also characteristically depends on the cell temperature and the state of charge. If the table shown in FIG. 15 is created based on the characteristics shown in FIGS. 16A and 16B, the dependence of the slow polarization voltage component on the current, the temperature, and the state of charge can be appropriately reflected by the table. In this manner, the accuracy of slow polarization voltage component estimation can be readily increased.

[Example Operation of the Device]

Figure 17:
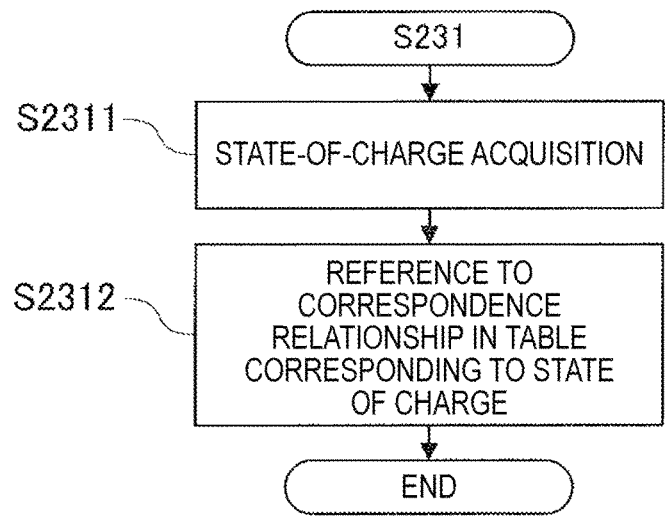
FIG. 17 is a flowchart showing an example operation of the power storage apparatus according to the second modification of the second embodiment of the present disclosure.

FIG. 17 is a flowchart showing an example operation of the power storage apparatus 1 of this modification. The example operation shown in FIG. 17 includes an embodiment of an open-circuit voltage estimation method according to the present disclosure.

In this modification, a series of procedures of steps 2311 (S2311) and 2312 (S2312) are carried out as a specific example of step 231 (S231) of FIG. 13.

Specifically, in step 2311 (S2311), the polarization voltage calculator 322 acquires the state of charge from the state-of-charge calculator 4.

In step 2312 (S2312), the polarization voltage calculator 322 refers to the table showing the correspondence relationship corresponding to the state of charge acquired in step 2311 (S2311).

With the power storage apparatus 1 of this modification, the same effects as those of the power storage apparatus 1 described with reference to FIG. 12 can be achieved, and the slow polarization voltage component can be calculated with even higher precision, as the state of charge is taken into account.

6. Third Modification of the Second Embodiment

[Example Structure of a Device]

A power storage apparatus 1 of this modification differs from the power storage apparatus 1 of FIG. 10 in the structure of the polarization voltage estimator 320.

[Polarization Voltage Estimator 320]

Figure 18:
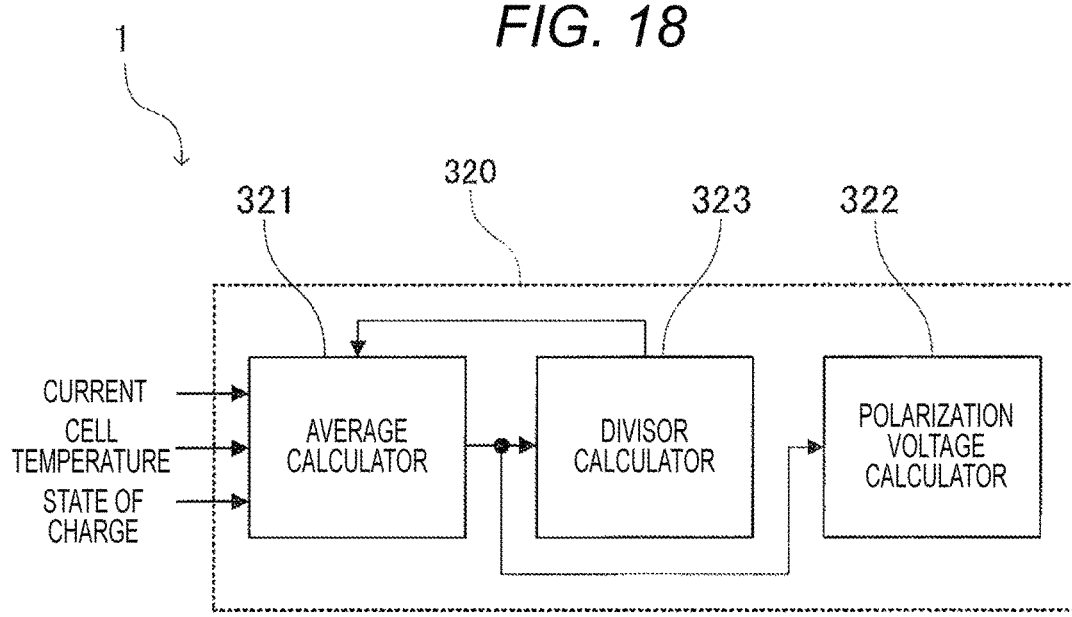
FIG. 18 is a diagram schematically showing an example structure of a power storage apparatus according to a third modification of the second embodiment of the present disclosure.

Specifically, as shown in FIG. 18, the polarization voltage estimator 320 of this modification includes a divisor calculator 323.

[Divisor Calculator 323]

The divisor calculator 323 is designed to calculate the divisor to be used by the average calculator 321 to calculate the average value(s). The divisor calculator 323 may calculate the divisor by using the table shown in FIG. 19B, for example. The table in FIG. 19B shows the correspondence relationship among the temperature and the current of the secondary cell 2 and the timing information [sec] pertaining to the divisor. The table in FIG. 19B is the table corresponding to a state of charge of 60%, but the divisor calculator 323 may be designed to refer to a different table for each state of charge. FIG. 19A is a table in which the temperature and the current of the secondary cell 2 are allocated in the same pattern as in FIG. 19B, and the table shows the relationship among the temperature, the current, and the slow polarization voltage component.

The timing information pertaining to the divisor in FIG. 19B may correspond to the time constant of the slow polarization voltage component associated with the same temperature and the same current in FIG. 19A. In a case where the time constant of the slow polarization voltage component is used as the timing information pertaining to the divisor, this time constant may be the time constant of the current-flowing slow polarization voltage component determined by fitting or the like from the voltage trajectory at a time of switching from constant current charge to constant current discharge.

The divisor calculator 323 may be designed to calculate the divisor to be used in calculating the next average value(s) by referring to the table shown in FIG. 19B. For example, in FIG. 19B, the average value of the present temperature is 20° C., and the average value of the current is 2 A. In this case, the divisor calculator 323 acquires 60 seconds as the timing information pertaining to the divisor. The divisor calculator 323 may divide the acquired timing information (60 seconds) by a predetermined operation period (one second, for example), to determine the divisor (60, for example) to be used in calculating the next average values of the temperature and the current. Since a temperature change is slower than a current change, the table shown in FIG. 19B does not exclude applications to divisor calculations based on one measured value of temperature, instead of an average value. That is, cases where one measured value of temperature is used in calculating a slow polarization voltage component are also within the scope of the present disclosure.

[Average Calculator 321]

The results of calculations performed by the average calculator 321 based on the result of a calculation performed by the divisor calculator 323 can be represented by the following equations (2).

$$I_{avg} = \frac{\sum_{k=0}^{N-1} I_{t-k}}{N}$$ [Mathematical Formula 2]

$$T_{avg} = \frac{\sum_{k=0}^{N-1} T_{t-k}}{N}$$

In the equations (2), $I_{avg}$ represents the average value of current at time t. $I_{t-1}$ is the previous value of current. N represents the divisor. $T_{avg}$ represents the average value of temperature at time t. $T_{t-1}$ is the previous temperature.

[Example Operation of the Device]

[First Flowchart]

Figure 20:
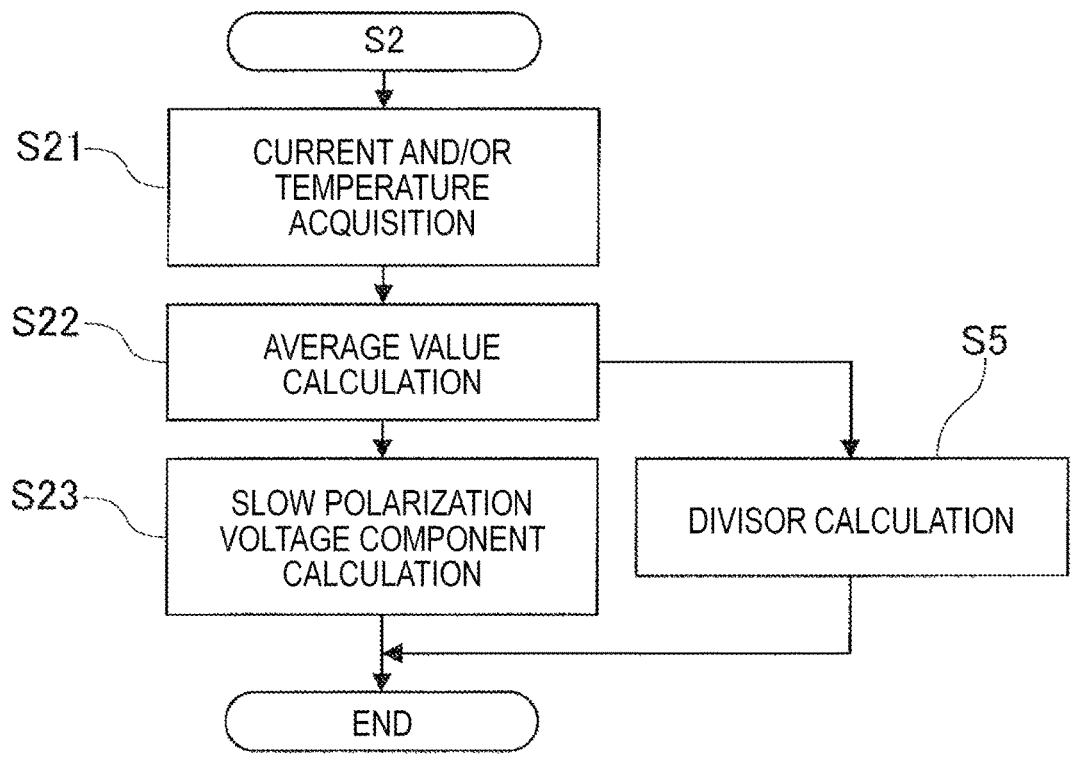
FIG. 20 is a first flowchart showing an example operation of the power storage apparatus according to the third modification of the second embodiment of the present disclosure.

FIG. 20 is a first flowchart showing an example operation of the power storage apparatus 1 of this modification. The example operation shown in FIG. 20 includes an embodiment of an open-circuit voltage estimation method according to the present disclosure.

In this modification, step 5 (S5) is carried out after step 22 (S22) shown in FIG. 11.

Specifically, in step 5 (S5), the divisor calculator 323 calculates the divisor to be used in calculating the next average value(s) based on the average value(s) calculated in step 22 (S22).

[Second Flowchart]

Figure 21:
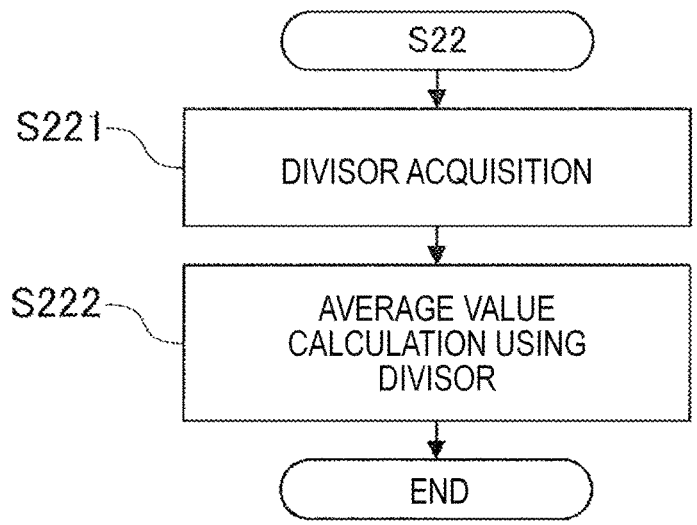
FIG. 21 is a second flowchart showing an example operation of the power storage apparatus according to the third modification of the second embodiment of the present disclosure.

In this modification, a series of procedures of steps 221 (S221) and 222 (S222) of FIG. 21 are carried out as a specific example of step 22 (S22) of FIG. 11.

Specifically, in step 221 (S221), the average calculator 321 acquires a divisor from the divisor calculator 323.

In step 222 (S222), the average calculator 321 calculates the average value(s) of the current and/or the temperature of the secondary cell 2 by using the divisor acquired in step 221 (S221).

[Third Flowchart]

Figure 22:
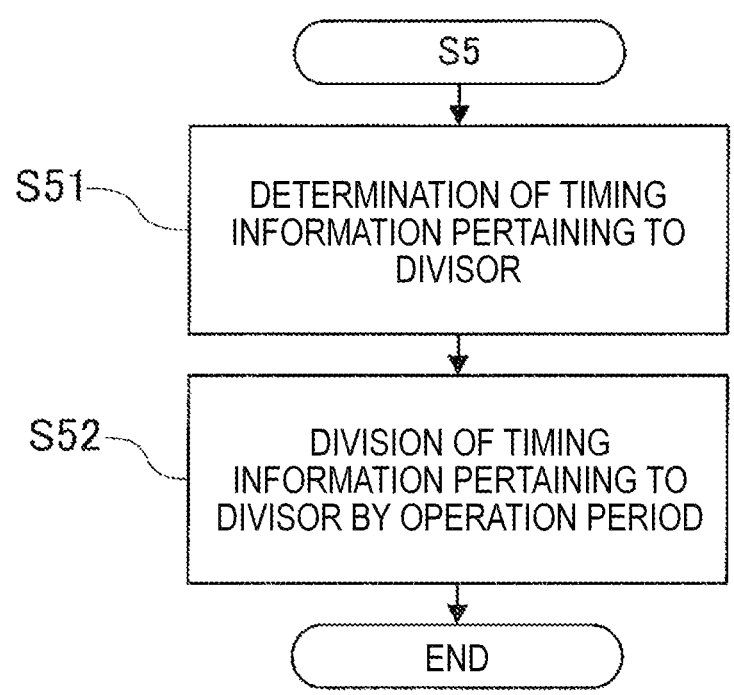
FIG. 22 is a third flowchart showing an example operation of the power storage apparatus according to the third modification of the second embodiment of the present disclosure.

In this modification, a series of procedures of steps 51 (S51) and 52 (S52) of FIG. 22 are further carried out as a specific example of step 5 (S5) of FIG. 20.

Specifically, in step 51 (S51), the divisor calculator 323 refers to the table corresponding to the present state of charge, and determines the timing information pertaining to the divisor corresponding to the current and the cell temperature at present.

In step 52 (S52), the divisor calculator 323 calculates the divisor by dividing the timing information determined in step 51 (S51) by a predetermined operation period.

With the power storage apparatus 1 of this modification, the same effects as those of the power storage apparatus 1 of FIG. 14 can be achieved, and average values that flexibly reflect time-dependent changes in current and cell temperature can be dynamically calculated.

7. Fourth Modification of the Second Embodiment

A power storage apparatus 1 of this modification differs from the power storage apparatus 1 described with reference to FIG. 12 in the structure of the polarization voltage estimator 320.

Figure 23:
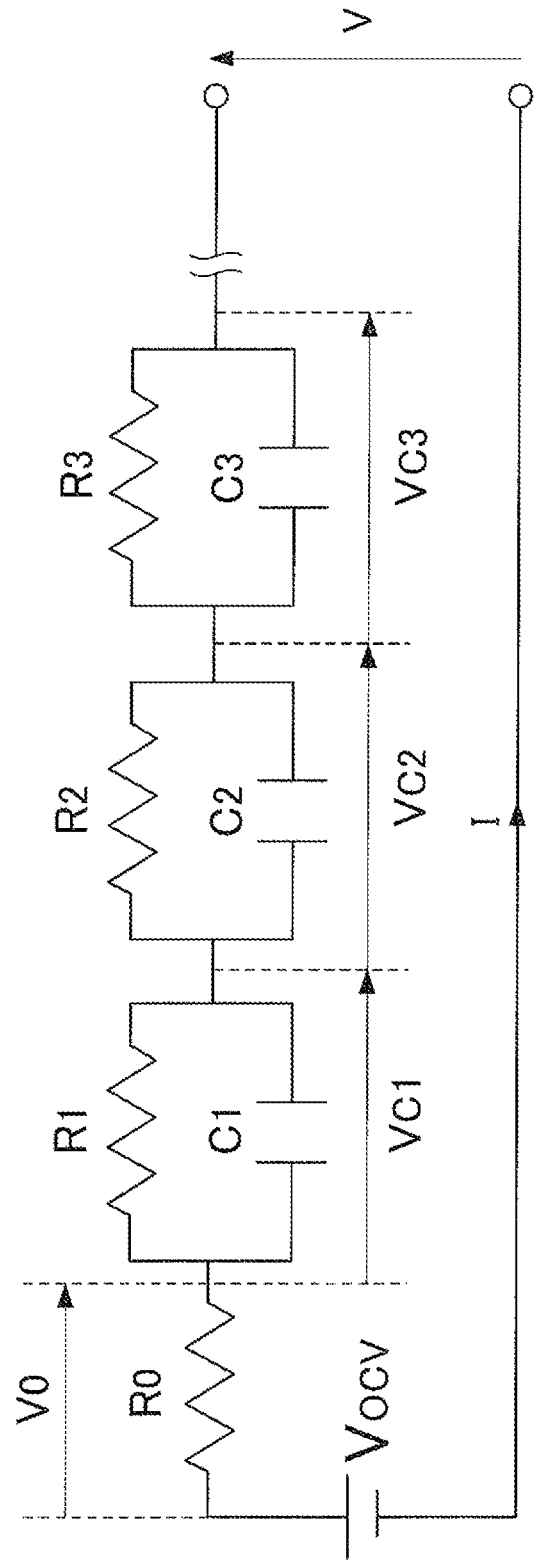
FIG. 23 is an equivalent circuit diagram of a secondary cell for explaining an example structure of a power storage apparatus according to a fourth modification of the second embodiment of the present disclosure.

Specifically, as shown in FIG. 23, the power storage apparatus 1 of this modification is designed to estimate slow polarization voltage components having different time constants from one another, with the secondary cell 2 being regarded as an equivalent circuit including three or more RC parallel circuits.

In the estimation of slow polarization voltage components, a table that shows the correspondence relationship among the cell temperature, the current, and the slow polarization voltage components as shown in FIG. 24 may be used. The calculation of each slow polarization voltage component with reference to a table and the correction of an open-circuit voltage value with each calculated slow polarization voltage component are the same as those described above with reference to FIG. 13 and others.

According to this modification, the same effects as those of the power storage apparatus 1 described with reference to FIG. 12 can be achieved, and the accuracy of open-circuit voltage value estimation can be further increased by estimating more than one slow polarization voltage component.

8. Third Embodiment

[Example Structure of a Device]

A power storage apparatus 1 of this embodiment differs from the power storage apparatus 1 of FIG. 18 in the structure of the polarization voltage calculator 322.

Specifically, the polarization voltage calculator 322 is designed to calculate a slow polarization voltage component by interpolating a value in a table when the table does not include the value corresponding to an average value calculated by an average calculator 321. The table shown in FIG. 19A may be used, for example.

The type of interpolation is not particularly limited. For example, the polarization voltage calculator 322 may be designed to perform linear interpolation, spline interpolation, or the like. The polarization voltage calculator 322 may also be designed to perform linear interpolation by using the value closest to an average value in the table.

[Example Operation of the Device]

The example operation described below includes an embodiment of an open-circuit voltage estimation method according to the present disclosure.

[Linear Interpolation in a Case where Temperature Corresponds to a Value in the Table but Current does not Correspond to a Value in the Table]

In a case where the table includes the temperature value corresponding to the average temperature value calculated by the average calculator 321 but does not include the current value corresponding to the average current value calculated by the average calculator 321, the polarization voltage calculator 322 may perform linear interpolation according to the following equation (3).

$$V = \frac{(V_H - V_L)}{(I_H - I_L)} \cdot I_{avg} + \frac{(I_H V_L - I_L V_H)}{(I_H - I_L)} \quad \text{[Mathematical Formula 3]}$$

Figure 25:
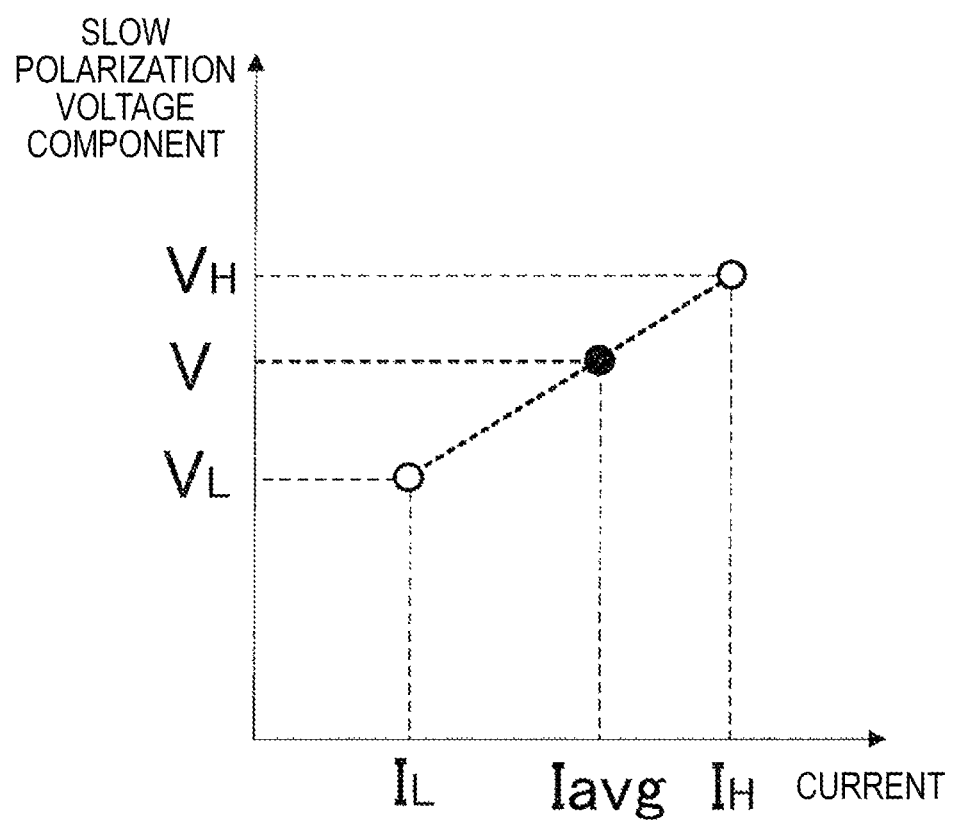
FIG. 25 is a graph for explaining linear interpolation to be performed when the cell temperature corresponds to a value in the table and the current does not correspond to a value in the table in an example operation of a power storage apparatus according to a third embodiment of the present disclosure.

In the equation (3), V represents the slow polarization voltage component calculated through the linear interpolation. $I_{avg}$ represents the average current value calculated by the average calculator 321. $I_H$ represents the current value that exists in the table and is the value closest to $I_{avg}$ on the high-current side. $I_L$ represents the current value that exists in the table and is the value closest to $I_{avg}$ on the low-current side. $V_H$ represents the slow polarization voltage component that exists in the table and is the value corresponding to $I_H$. $V_L$ represents the slow polarization voltage component that exists in the table and is the value corresponding to $I_L$. V in the equation (3) satisfies the relationship represented by the linear function shown in FIG. 25, with I being the variable. In the linear function in FIG. 25, $(V_H-V_L)/(I_H-I_L)$ represents the slope, and $(I_H V_L - I_L V_H)/(I_H - I_L)$ represents the intercept on the slow polarization voltage component side.

When sensing that the temperature corresponds to a value in the table but the current does not correspond to any value in the table, the polarization voltage calculator 322 extracts the two points $I_L$ and $I_H$ closest to $I_{avg}$ from the table, and also extracts the slow polarization voltage components $V_L$ and $V_H$ corresponding to the two points $I_L$ and $I_H$ from the table. The polarization voltage calculator 322 may then plug the extracted values $I_L$, $I_H$, $V_L$, and $V_H$, and the value $I_{avg}$ acquired from the average calculator 321 into the equation (3), to calculate the slow polarization voltage component.

An example case where the table shown in FIG. 19A is used is now described. The average temperature value calculated by the average calculator 321 is 20° C., and there exists the corresponding temperature value (20° C.) in the table, for example. Meanwhile, the average current value $I_{avg}$ calculated by the average calculator 321 is 3 A, and the table does not include the corresponding current value (3 A), for example. In this case, 2 A is extracted as $I_L$, and 4 A is extracted as $I_H$ from the fields corresponding to 20° C. Also, 10 mV is extracted as $V_L$, and 20 mV is extracted as $V_H$ from the fields corresponding to 20° C. As these values $I_{avg}$, $I_L$, $I_H$, $V_L$, and $V_H$ are plugged into the equation (3), 15 mV is obtained as the slow polarization voltage component.

[Linear Interpolation in a Case where Current Corresponds to a Value in the Table but Temperature does not Correspond to a Value in the Table]

In a case where the table includes the current value corresponding to the average current value calculated by the average calculator 321 but does not include the temperature value corresponding to the average temperature value calculated by the average calculator 321, the polarization voltage calculator 322 may perform linear interpolation according to the following equation (4).

$$V = \frac{(V_H - V_L)}{(T_H - T_L)} \cdot T_{avg} + \frac{(T_H V_L - T_L V_H)}{(T_H - T_L)} \quad \text{[Mathematical Formula 4]}$$

Figure 26:
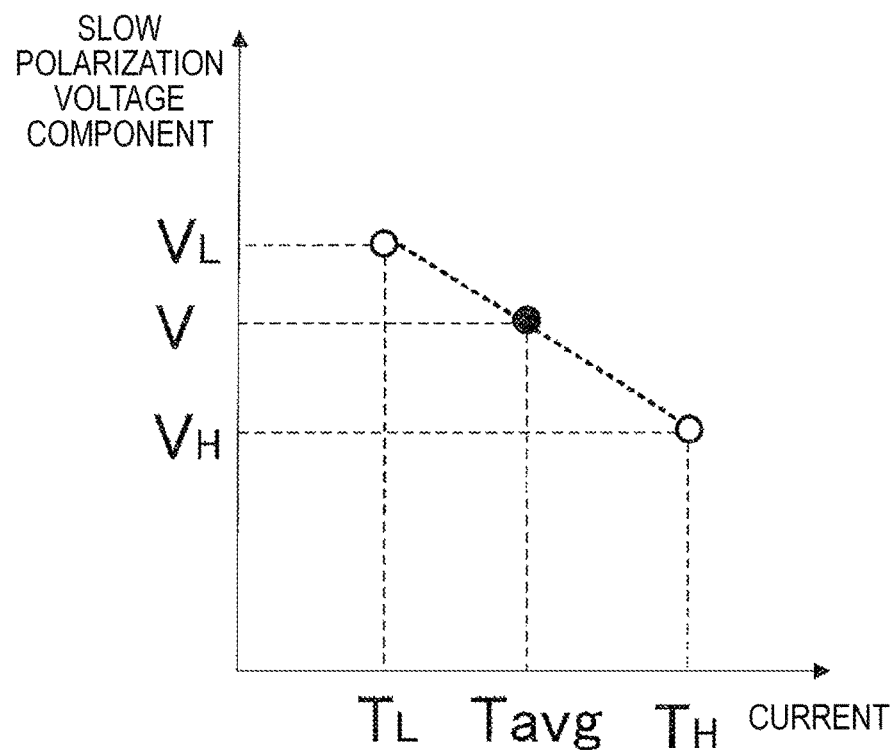
FIG. 26 is a graph for explaining linear interpolation to be performed when the current corresponds to a value in the table and the cell temperature does not correspond to a value in the table in an example operation of the power storage apparatus according to the third embodiment of the present disclosure.

In the equation (4), V represents the slow polarization voltage component calculated through the linear interpolation. $T_{avg}$ represents the average temperature value calculated by the average calculator 321. $T_H$ represents the temperature value that exists in the table and is the value closest to $T_{avg}$ on the high-temperature side. $T_L$ represents the temperature value that exists in the table and is the value closest to $T_{avg}$ on the low-temperature side. $V_H$ represents the slow polarization voltage component that exists in the table and is the value corresponding to $T_H$. $V_L$ represents the slow polarization voltage component that exists in the table and is the value corresponding to $T_L$. V in the equation (4) satisfies the relationship represented by the linear function shown in FIG. 26, with T being the variable. In the linear function in FIG. 26, $(V_H-V_L)/(T_H-T_L)$ represents the slope, and $(T_H V_L - T_L V_H)/(T_H-T_L)$ represents the intercept on the slow polarization voltage component side. The calculation of the slow polarization voltage component according to the equation (4) is the same as that in the case where the equation (3) is used, and therefore, explanation thereof will not be made herein.

[Linear Interpolation in a Case where Temperature and Current do not Correspond to any Values in the Table]

In a case where the table includes neither the temperature value corresponding to the average temperature value calculated by the average calculator 321 nor the current value corresponding to the average current value calculated by the average calculator 321, the polarization voltage calculator 322 may perform linear interpolation involving the following steps, for example.

$T_H$ and $T_L$ are extracted in accordance with $T_{avg}$ (STEP 1).

$I_H$, $I_L$, $V_H$, and $V_L$ are extracted in accordance with $I_{avg}$, with reference to the fields of the current corresponding to $T_H$ in the table (STEP 2-1).

$I_H$, $I_L$, $V_H$, and $V_L$ are extracted in accordance with $I_{avg}$, with reference to the fields of the current corresponding to $T_L$ in the table (STEP 2-2).

A slow polarization voltage component is calculated by plugging the values $I_{avg}$, $I_H$, $I_L$, $V_H$, and $V_L$ from STEP 2-1 into the equation (3) (STEP 3-1).

A slow polarization voltage component is calculated by plugging the values $I_{avg}$, $I_H$, $I_L$, $V_H$, and $V_L$ from STEP 2-2 into the equation (3) (STEP 3-2).

The slow polarization voltage component calculated in STEP 3-1 is assigned to $V_H$ in the equation (4), the slow polarization voltage component calculated in STEP 3-2 is assigned to $V_L$ in the equation (4), and $T_{avg}$, $T_H$, and $T_L$ from STEP 1 are plugged into the equation (4), to calculate the slow polarization voltage component (STEP 4).

An example case where the table shown in FIG. 19A is used is now described. The average temperature value calculated by the average calculator 321 is 24° C., and the table does not include the corresponding temperature value, for example. Meanwhile, the average current value $I_{avg}$ calculated by the average calculator 321 is 3 A, and the table does not include the corresponding current value, for example. In this case, $T_H$=30° C. and $T_L$=20° C. are extracted from the table in accordance with $I_{avg}$=24° C. (STEP 1).—$I_H$=4 A, $I_L$=2 A, $V_H$=14 mV, and $V_L$=7 mV are extracted in accordance with $I_{avg}$=3 A, with reference to the fields of the current corresponding to $T_H$=30° C. in the table (STEP 2-1).—Also, $I_H$=4 A, $I_L$=2 A, $V_H$=20 mV, and $V_L$=10 mV are extracted in accordance with $I_{avg}$=3 A, with reference to the fields of the current corresponding to $T_L$=20° C. in the table (STEP 2-2). The slow polarization voltage component corresponding to $T_H$=30° C. is then calculated. This calculation is performed by plugging the values from STEP 2-1, which are $I_{avg}$=3 A, $I_H$=4 A, $I_L$=2 A, $V_H$=14 mV, and $V_L$=7 mV, into the equation (3) (STEP 3-1). As a result, the slow polarization voltage component corresponding to $T_H$=30° C. is determined to be 10.5 mV. The slow polarization voltage component corresponding to $T_L$=20° C. is also calculated. This calculation is performed by plugging the values from STEP 2-2, which are $I_{avg}$=3 A, $I_H$=4 A, $I_L$=2 A, $V_H$=20 mV, and $V_L$=10 mV, into the equation (3) (STEP 3-2). As a result, the slow polarization voltage component corresponding to $T_L$=20° C. is determined to be 15 mV. After that, 10.5 mV, which corresponds to $T_H$=30° C., is assigned to $V_H$ in the equation (4), 15 mV, which corresponds to $T_L$=20° C., is assigned to $V_L$ in the equation (4), and $T_{avg}$=24° C., $T_H$=30° C., and $T_L$=20° C. are also plugged into the equation (4) (STEP 4). As a result, the slow polarization voltage component corresponding to the temperature of 24° C. and the current of 3 A is determined to be 13.2 mV.

With the power storage apparatus 1 of this embodiment, the same effects as those of the power storage apparatus 1 of FIG. 18 can be achieved, and the slow polarization voltage component can be appropriately calculated even when the resolution of the table is low.

9. Fourth Embodiment

[Example Structure of a Device]

A power storage apparatus 1 of this embodiment differs from the power storage apparatus 1 of the third embodiment in the structure of the open-circuit voltage calculator 310.

Figure 27:
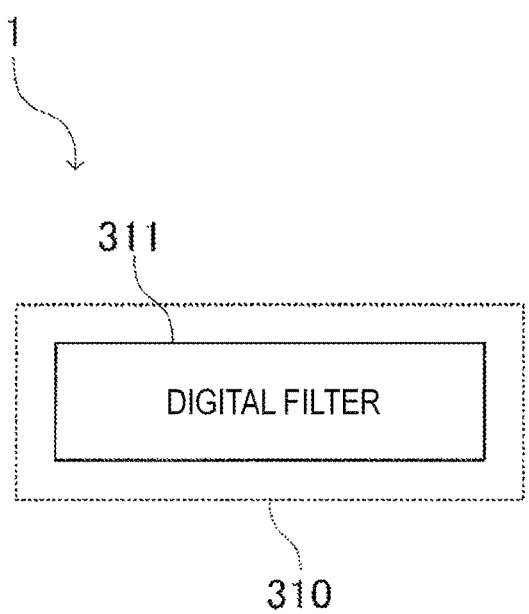
FIG. 27 is a diagram schematically showing an example structure of a power storage apparatus according to a fourth embodiment of the present disclosure.

Specifically, as shown in FIG. 27, the open-circuit voltage calculator 310 of this embodiment includes a digital filter 311. The digital filter 311 is designed to update the parameters $R_1$, $R_2$, $C_1$, $C_2$, and the like of the equivalent circuit shown in FIG. 2 based on measured values of the voltage and the current of the secondary cell 2. The open-circuit voltage calculator 310 is designed to dynamically calculate an open-circuit voltage value by using the parameters updated by the digital filter 311.

The digital filter 311 is not limited to any particular form. For example, the digital filter 311 may be an adaptive filter or the like, or may be a Kalman filter or the like.

[Example Operation of the Device]

Figure 28:
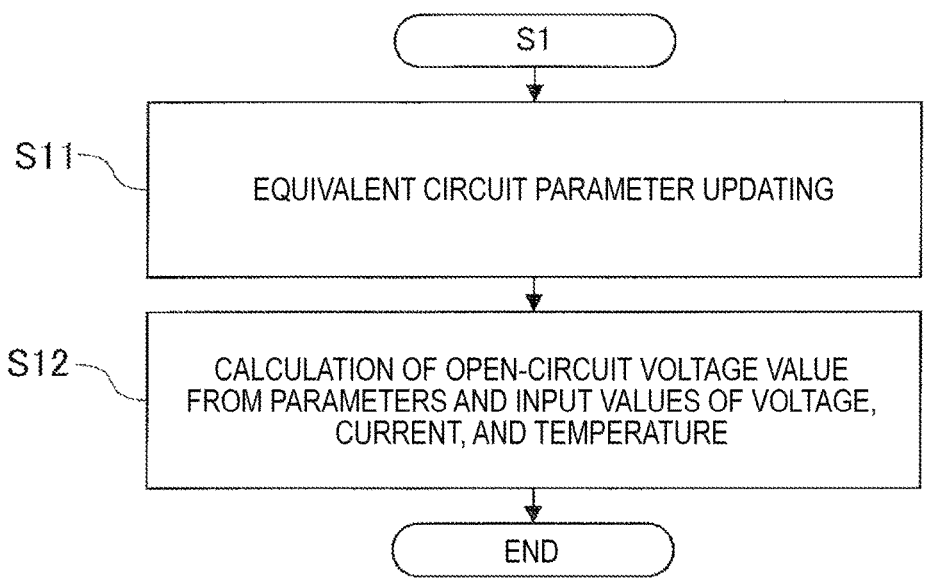
FIG. 28 is a flowchart showing an example operation of the power storage apparatus according to the fourth embodiment of the present disclosure.

FIG. 28 is a flowchart showing an example operation of the power storage apparatus 1 of this embodiment. The example operation shown in FIG. 28 includes an embodiment of an open-circuit voltage estimation method according to the present disclosure.

In this embodiment, a series of procedures of steps 11 (S11) and 12 (S12) are carried out as a specific example of step 1 (S1) of FIG. 5.

Specifically, in step 11 (S11), the digital filter 311 updates the parameters of the equivalent circuit.

In step 12 (S12), the open-circuit voltage calculator 310 calculates an open-circuit voltage value from the parameters updated in step 11 (S11) and the input values of voltage, current, and temperature.

With the power storage apparatus 1 of this embodiment, the same effects as those of the power storage apparatus 1 of the third embodiment can be achieved, and an open-circuit voltage value that flexibly reflects changes in input values can be calculated by optimizing the equivalent circuit as needed.

10. First Modification of the Fourth Embodiment

[Example Structure of a Device]

A power storage apparatus 1 of this modification differs from the power storage apparatus 1 of FIG. 27 in that the digital filter 311 is an adaptive filter.

[Example Operation of the Device]

The operating principles of an adaptive filter are described below as an example operation of the power storage apparatus 1 of this modification.

In the equivalent circuit shown in FIG. 2, the impedance between the terminals of the secondary cell 2 is expressed by the following equation (5).

[Mathematical Formula 5]
$$R_0 + \frac{1}{\frac{1}{R_1} + j\omega C_1} + \frac{1}{\frac{1}{R_2} + j\omega C_2} = R_0 + \frac{R_1}{1 + j\omega R_1 C_1} + \frac{R_2}{1 + j\omega R_2 C_2}$$

Where the impedance according to the equation (5) is represented by a Laplace space, the impedance is expressed by the following equation (6).

[Mathematical Formula 6]
$$Z(s) = R_0 + \frac{R_1}{1 + R_1 C_1 s} + \frac{R_2}{1 + R_2 C_2 s}$$

Where the voltage between the terminals of the secondary cell 2 is represented by a Laplace space, the voltage between the terminals is expressed by the following equation (7).

[Mathematical Formula 7]
$$V(s) = \left\{ R_0 + \frac{R_1}{1 + R_1 C_1 s} + \frac{R_2}{1 + R_2 C_2 s} \right\} \cdot I(s) + V_{ocv}(s)$$

As the voltage between the terminals is to be processed in digital signal processing, the equation (7) is expressed in z-space, and as a result, the following equation (8) is obtained.

[Mathematical Formula 8]
$$V(k) = \frac{b_0 + b_1 z^{-1} + b_2 z^{-2}}{1 + a_1 z^{-1} + a_2 z^{-2}} \cdot I(k) + V_{ocv}(k)$$

In the equation (8), $a_1$, $a_2$, $b_0$, $b_1$, and $b_2$ are variables represented by $R_0$, $R_1$, $R_2$, $C_1$, and $C_2$ in the equivalent circuit, and an operation period Ts.

The following equations (9) are obtained by modifying the equation (8).

$$V(k) = -a_1 \cdot V(k-1) - a_2 \cdot V(k-2) + b_0 \cdot I(k) + b_1 \cdot I(k-1) + b_2 \cdot I(k-2) + (1 + a_1 + a_2) \cdot V_{OCV}(k)$$

$$V_{OCV}(k) \cong V_{OCV}(k-1) \cong V_{OCV}(k-2) \quad \text{[Mathematical Formula 9]}$$

The voltage V(k−1) at the previous time is expressed by the following equation (10).

$$V(k-1) = -a_1 \cdot V(k-2) - a_2 \cdot V(k-3) + b_0 \cdot I(k-1) + b_1 \cdot I(k-2) + b_2 \cdot I(k-3) + (1 + a_1 + a_2) \cdot V_{OCV}(k-1) \quad \text{[Mathematical Formula 10]}$$

According to the equations (9) and (10), a voltage change ΔV(k) is expressed by the following equations (11).

$$\Delta V(k) = -a_1 \cdot \Delta V(k-1) - a_2 \cdot \Delta V(k-2) + b_0 \cdot \Delta I(k) + b_1 \cdot \Delta I(k-1) + b_2 \cdot \Delta I(k-2)$$

$$\Delta V(k) = V(k) - V(k-1), \quad \Delta I = I(k) - I(k-1) \quad \text{[Mathematical Formula 11]}$$

Where the equations (11) are expressed by matrices, the following equation (12) is obtained.

[Mathematical Formula 12]
$$\Delta V(k) = [\Delta V(k-1) \, \Delta V(k-2) \, \Delta I(k) \, \Delta I(k-1) \, \Delta I(k-2)] \cdot \begin{bmatrix} -a_1 \\ -a_2 \\ b_0 \\ b_1 \\ b_2 \end{bmatrix} = \varphi^t(k) \cdot \theta$$

In the equation (12), φ represents a data matrix. θ represents the coefficient matrix of an equivalent circuit model. The superscript "t" represents matrix transposition.

As an example algorithm for performing system identification on the coefficient matrix of the equivalent circuit model from the voltage V and the current I as measured values, there is a system identification algorithm using the iterative least squares technique. This algorithm is expressed by the following equations (13).

[Mathematical Formula 13]
$$\hat{\theta}(k) = \hat{\theta}(k-1) + \frac{P(k-1) \cdot \varphi(k)}{\lambda + \varphi^t(k) \cdot P(k-1) \cdot \varphi(k)} \cdot \varepsilon(k)$$

$$\varepsilon(k) = \Delta V(k) - \varphi^t(k) \cdot \hat{\theta}(k-1)$$

$$P(k) = \frac{1}{\lambda} \left\{ P(k-1) - \frac{P(k-1) \cdot \varphi(k) \cdot \varphi^t(k) \cdot P(k-1)}{\lambda + \varphi^t(k) \cdot P(k-1) \cdot \varphi(k)} \right\}$$

In the equation (13), P represents a covariance matrix. ε represents an identification error. λ represents a positive number that is called a forgetting factor and is equal to or smaller than 1. The superscript "∧" represents an estimated value.

With the use of the coefficient of the equivalent circuit model obtained through system identification, an open-circuit voltage value $V_{OCV}(k)$ is calculated according to the following equation (14).

[Mathematical Formula 14]
$$V_{ocv}(k) = \frac{1}{1 + a_1 + a_2} \{ V(k) + a_1 \cdot V(k-1) + a_2 \cdot V(k-2) - b_0 \cdot I(k) - b_1 \cdot I(k-1) - b_2 \cdot I(k-2) \}$$

In the power storage apparatus 1 of this modification, an open-circuit voltage value is calculated by using an adaptive filter. Accordingly, an open-circuit voltage with a certain degree of precision can be obtained as the open-circuit voltage value yet to be subjected to the correction by the open-circuit voltage corrector 330, regardless of non-linear changes in polarization voltage. In some common cases, the time length of the input data to be used in one calculation by an adaptive filter (three seconds when the sampling period is one second and the number of input samples is three, for example) is smaller than the time constant of the slow polarization voltage component (60 seconds, for example). In such cases, a change in the slow polarization voltage component may be impossible to be reflected by the result of the calculation, and it becomes difficult to calculate an open-circuit voltage value with high precision. Also, even when the time length of input data is greater than the time constant of the slow polarization voltage component, it is difficult to cause a calculation to reflect a change in the slow polarization voltage component and calculate an open-circuit voltage value with high precision, if the change in the slow polarization voltage component during the period corresponding to the time length is small. In this modification, on the other hand, an open-circuit voltage value calculated by using an adaptive filter is corrected by the open-circuit voltage corrector 330. Accordingly, an open-circuit voltage corrector with sufficiently high precision can be obtained, with the slow polarization voltage component being taken into account.

11. Fifth Embodiment

[Example Structure of a Device]

A power storage apparatus 1 of this embodiment differs from the power storage apparatus 1 of any of the first through fourth embodiments in the structure of the open-circuit voltage estimation device 300.

Specifically, the open-circuit voltage estimation device 300 of this embodiment is designed to estimate an open-circuit voltage based on terminal voltage information, current information, cell temperature information about the secondary cell 2 acquired through communication.

Figure 29:
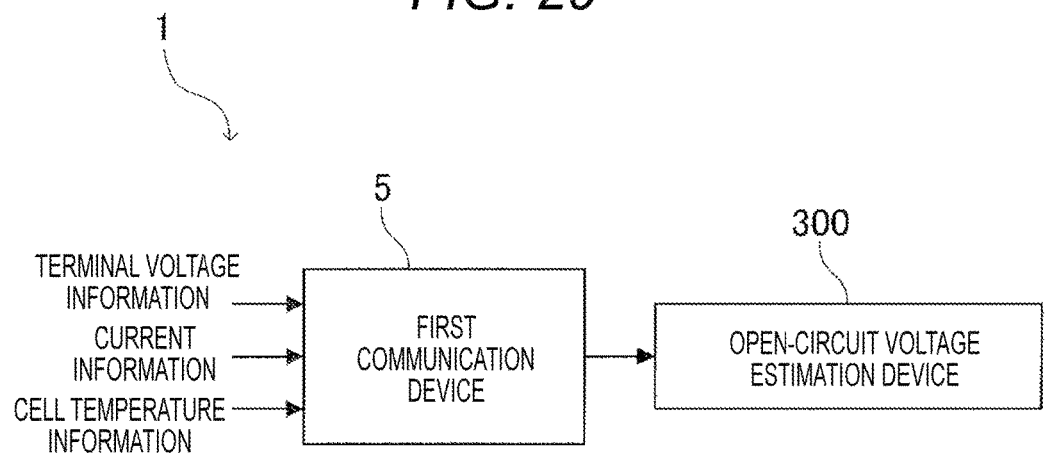
FIG. 29 is a diagram schematically showing an example structure of a power storage apparatus according to a fifth embodiment of the present disclosure.

FIG. 29 shows a more specific example structure. As shown in FIG. 29, the power storage apparatus 1 includes a first communication device 5. The open-circuit voltage estimation device 300 receives terminal voltage information, current information, and cell temperature information about the secondary cell 2 through communication via the first communication device 5. Based on the received information, the open-circuit voltage estimation device 300 calculates an open-circuit voltage value with the open-circuit voltage calculator 310, estimates a slow polarization voltage component with the polarization voltage estimator 320, and corrects the open-circuit voltage value with the open-circuit voltage corrector 330.

The open-circuit voltage estimation device 300 may be located in a position that is isolated from the secondary cell 2. The open-circuit voltage estimation device 300 may be connected to and communicate with a structure on the side of the secondary cell 2 via a network. The network may be an external network or the like. The external network may be the Internet or the like. The open-circuit voltage estimation device 300 may be a server or the like on the Internet. The method to be used by the open-circuit voltage estimation device 300 to receive information about the secondary cell 2 is not particularly limited, and reception of information about the secondary cell 2 by the open-circuit voltage estimation device 300 through any route is included in the scope of the present disclosure. The communication method to be used by the first communication device 5 is not limited to any particular method, either. The first communication device 5 may be included in the open-circuit voltage estimation device 300.

[Example Operation of the Device]

Figure 30:
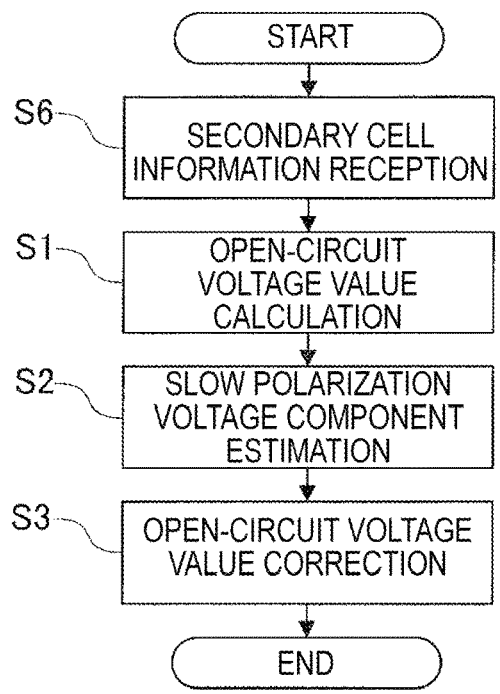
FIG. 30 is a flowchart showing an example operation of the power storage apparatus according to the fifth embodiment of the present disclosure.

FIG. 30 is a flowchart showing an example operation of the power storage apparatus 1 of this embodiment. The example operation shown in FIG. 30 includes an embodiment of an open-circuit voltage estimation method according to the present disclosure.

In this embodiment, step 6 (S6) is carried out before step 1 (S1) of FIG. 5. Specifically, in step 6 (S6), the open-circuit voltage estimation device 300 receives terminal voltage information, current information, and cell temperature information about the secondary cell 2 through communication. The trigger for the reception is not particularly limited. For example, the side of the open-circuit voltage estimation device 300 may request the information about the secondary cell 2 from the side of the secondary cell 2, and the side of the secondary cell 2 may respond to the request. Alternatively, the information about the secondary cell 2 may be constantly or regularly transmitted from the side of the secondary cell 2 to the side of the open-circuit voltage estimation device 300.

According to this embodiment, the same effects as those of the first through fourth embodiments can be achieved, and the single open-circuit voltage estimation device 300 can estimate open-circuit voltage values of secondary cells 2 placed at various locations.

12. First Modification of the Fifth Embodiment

[Example Structure of a Device]

A power storage apparatus 1 of this modification differs from the power storage apparatus 1 of FIG. 29 in the structure on the side of the secondary cell 2.

Figure 31:
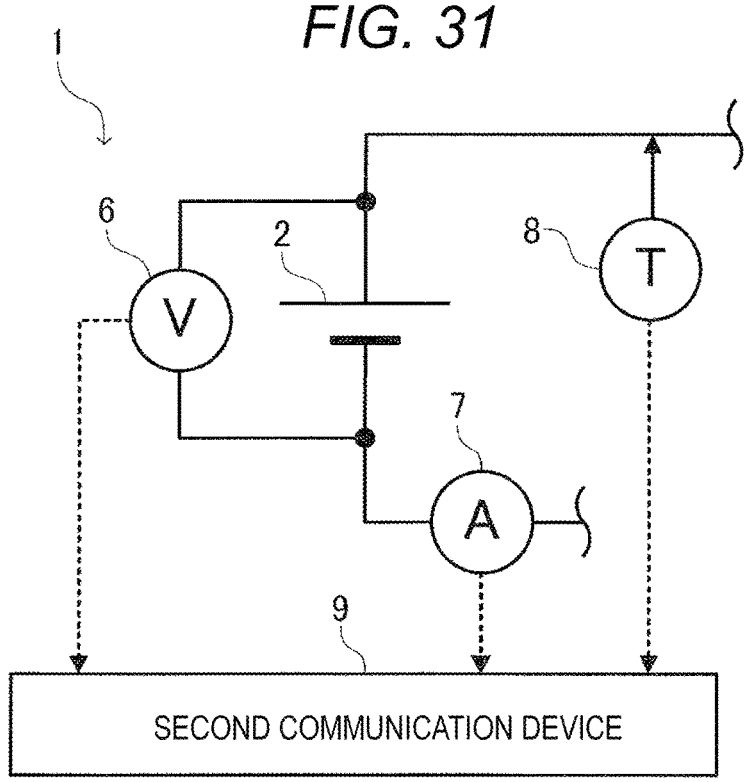
FIG. 31 is a diagram schematically showing an example structure of a power storage apparatus according to a first modification of the fifth embodiment of the present disclosure.

Specifically, as shown in FIG. 31, the power storage apparatus 1 of this modification further includes a voltmeter 6, an ammeter 7, and a thermometer 8 that are connected to the secondary cell 2, and a second communication device 9 connected to the respective measuring instruments 6, 7, and 8.

The voltmeter 6 is designed to measure the terminal voltage of the secondary cell 2 and output the measurement result to the second communication device 9. The ammeter 7 is designed to measure the charging/discharging current of the secondary cell 2 and output the measurement result to the second communication device 9. The thermometer 8 is designed to measure the temperature of the secondary cell 2 and output the measurement result to the second communication device 9. The second communication device 9 is designed to transmit the measurement information from the measuring instruments 6 through 8 to the open-circuit voltage estimation device 300. The measuring instruments 6 through 8 and the second communication device 9 are not limited to any particular forms.

[Example Operation of the Device]

Figure 32:
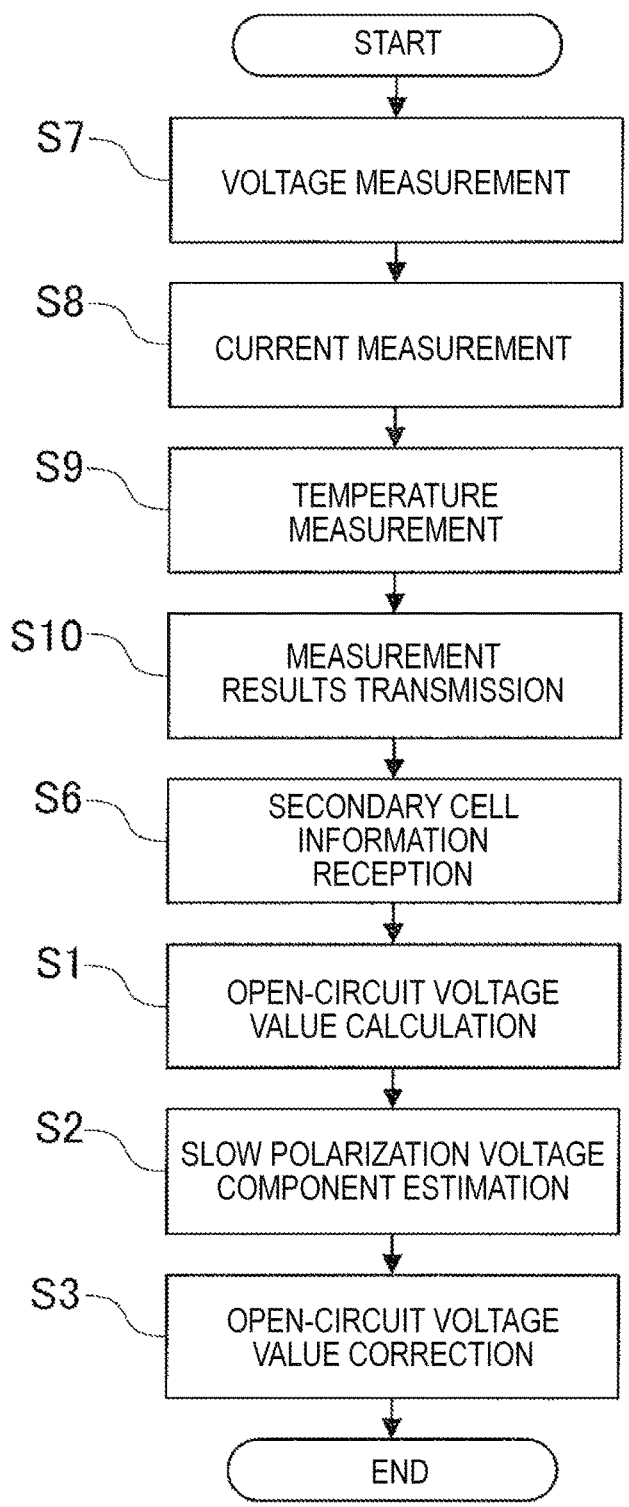
FIG. 32 is a flowchart showing an example operation of the power storage apparatus according to the first modification of the fifth embodiment of the present disclosure.

FIG. 32 is a flowchart showing an example operation of the power storage apparatus 1 of this embodiment. The example operation shown in FIG. 32 includes an embodiment of an open-circuit voltage estimation method according to the present disclosure.

In this embodiment, a series of procedures of steps 7 (S7) through 10 (S10) are carried out prior to step 6 (S6) of FIG. 30.

Specifically, in step 7 (S7), the voltmeter 6 measures the terminal voltage of the secondary cell 2 and outputs the measurement result to the second communication device 9.

In step 8 (S8), the ammeter 7 measures the current in the secondary cell 2 and outputs the measurement result to the second communication device 9.

In step 9 (S9), the thermometer 8 measures the temperature of the secondary cell 2 and outputs the measurement result to the second communication device 9. Steps 7 (S7) through 9 (S9) may be carried out in any order, or may be simultaneously carried out.

In step 10 (S10), the second communication device 9 transmits the measurement results received from the measuring instruments 6 through 8 to the side of the open-circuit voltage estimation device 300.

According to this modification, the same effects as those of the first through fourth embodiments can be achieved. Also, there is no need to prepare an open-circuit voltage estimation device 300 for each secondary cell 2, and accordingly, costs can be lowered.

The power storage apparatus 1 is not limited to any particular use, and may be suitably used for various loads in public, industrial, or household electricity storage systems, emergency power sources, or vehicles such as hybrid cars and electric vehicles. Where the present disclosure is applied to an emergency power source, it is possible to prevent an unexpected blackout due to inconsistency between an actual state of charge and a displayed state of charge in spite of an indication of a sufficient amount of remaining power on the display, for example. Where the present disclosure is applied to a vehicle, the vehicle can be prevented from unexpectedly stopping and failing to reach a destination in spite of an indication of a sufficient amount of remaining power on the display.

The above described embodiments and modifications can be combined as needed. The scope of the present disclosure also includes cases where a component of any one of the embodiments or the modifications is added to another one of the embodiments or the modifications, or is replaced with a component of another one of the embodiments or the modifications.

The power source that supplies energy to the secondary cell(s) 2 is not limited to any particular form, and may be any of the power sources for solar cells, wind power generators, power plants, and secondary cells having surplus power.

The above described advantageous effects of the respective embodiments and modifications are merely examples and are not limited to them, and the respective embodiments and modifications may have other advantageous effects. The present disclosure should achieve at least one of the above described advantageous effects of the respective embodiments and modifications.

The present disclosure may also be embodied in the structures described below.

(1) An open-circuit voltage estimation device including:
an open-circuit voltage calculator that calculates an open-circuit voltage value of a secondary cell;
a polarization voltage estimator that estimates a component having a relatively large time constant among polarization voltage components of the secondary cell; and
an open-circuit voltage corrector that corrects the open-circuit voltage value calculated by the open-circuit voltage calculator with the component having the relatively large time constant estimated by the polarization voltage estimator.

(2) The open-circuit voltage estimation device of (1), wherein the polarization voltage estimator includes: an average calculator that calculates an average value of at least one of current and cell temperature of the secondary cell; and a polarization voltage calculator that calculates the component having the relatively large time constant based on the average value calculated by the average calculator.

(3) The open-circuit voltage estimation device of (2), wherein the polarization voltage calculator calculates the component having the relatively large time constant based on a table that is acquired beforehand and shows the correspondence relationship between the average value and the component having the relatively large time constant.

(4) The open-circuit voltage estimation device of (3), wherein the table shows the correspondence relationship in accordance with the state of charge of the secondary cell, and the polarization voltage calculator calculates the component having the relatively large time constant by referring to the correspondence relationship corresponding to the acquired state of charge.

(5) The open-circuit voltage estimation device of (3) or (4), wherein the polarization voltage estimator includes a divisor calculator that calculates the divisor to be used by the average calculator in calculating the average value.

(6) The open-circuit voltage estimation device of any of (3) through (5), wherein the polarization voltage calculator calculates the component having the relatively large time constant by interpolating a value in the table.

(7) The open-circuit voltage estimation device of any of (1) through (6), further including a state-of-charge calculator that calculates the state of charge of the secondary cell based on the open-circuit voltage value corrected by the open-circuit voltage corrector, the state-of-charge calculator being connected to the open-circuit voltage estimation device.

(8) The open-circuit voltage estimation device of any of (1) through (7), wherein the open-circuit voltage calculator includes a digital filter.

(9) The open-circuit voltage estimation device of any of (1) through (8), wherein the open-circuit voltage value corrected with the component having the relatively large time constant is estimated based on terminal voltage information, current information, and cell temperature information about the secondary cell, the terminal voltage information, the current information, and the cell temperature information being acquired through communication.

(10) An open-circuit voltage estimation program for causing a computer to function as:
a unit that calculates an open-circuit voltage value of a secondary cell;
a unit that estimates a component having a relatively large time constant among polarization voltage components of the secondary cell; and
a unit that corrects the calculated open-circuit voltage value with the estimated component having the relatively large time constant.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST

1 Power storage apparatus
2 Secondary cell
300 Open-circuit voltage estimation device
310 Open-circuit voltage calculator
320 Polarization voltage estimator
330 Open-circuit voltage corrector The invention is claimed as follows:

1. An open-circuit voltage estimation device comprising:
an open-circuit voltage calculator configured to calculate an open-circuit voltage value of a secondary cell;
a polarization voltage estimator configured to (i) obtain a measured polarization voltage of the secondary cell, (ii) divide the polarization voltage of the secondary cell into at least a first component having a smaller time constant and a second component having a larger time constant, and (iii) estimate a voltage value of the second component having the larger time constant;

an open-circuit voltage corrector configured to correct the open-circuit voltage value calculated by the open-circuit voltage calculator with the voltage value of the second component having the larger time constant estimated by the polarization voltage estimator by adding the voltage value of the second component to the open: circuit voltage value during an overdischarge or subtracting the voltage value of the second component from the open: circuit voltage value during an overcharge; and a state-of-charge calculator configured to indicate a state of charge of the secondary cell based on the open-circuit voltage value corrected by the open-circuit voltage corrector.

2. The open-circuit voltage estimation device according to claim 1, wherein the polarization voltage estimator includes:
an average calculator configured to calculate an average value of at least one of current and cell temperature of the secondary cell; and
a polarization voltage calculator configured to calculate the second component having the larger time constant based on the average value calculated by the average calculator.

3. The open-circuit voltage estimation device according to claim 2, wherein the polarization voltage calculator calculates the second component having the larger time constant based on a table showing a correspondence relationship between the average value and the second component having the larger time constant, the table being acquired beforehand.

4. The open-circuit voltage estimation device according to claim 3, wherein the table shows the correspondence relationship in accordance with the state of charge of the secondary cell, and the polarization voltage calculator calculates the second component having the larger time constant by referring to the correspondence relationship corresponding to the acquired state of charge.

5. The open-circuit voltage estimation device according to claim 3, wherein the polarization voltage estimator includes a divisor calculator configured to calculate a divisor to be used by the average calculator in calculating the average value.

6. The open-circuit voltage estimation device according to claim 3, wherein the polarization voltage calculator calculates the second component having the larger time constant by interpolating a value in the table.

7. The open-circuit voltage estimation device according to claim 1, wherein the state-of-charge calculator is connected to the open-circuit voltage estimation device.

8. The open-circuit voltage estimation device according to claim 1, wherein the open-circuit voltage calculator includes a digital filter.

9. The open-circuit voltage estimation device according to claim 1, wherein the open-circuit voltage value corrected with the second component having the larger time constant is estimated based on terminal voltage information, current information, and cell temperature information about the secondary cell, the terminal voltage information, the current information, and the cell temperature information being acquired through communication.

10. A power storage apparatus comprising
a secondary cell, and
an open-circuit voltage estimation device,
wherein the open-circuit voltage estimation device includes:
an open-circuit voltage calculator configured to calculate an open-circuit voltage value of the secondary cell;
a polarization voltage estimator configured to (i) obtain a measured polarization voltage of the secondary cell, (ii) divide the polarization voltage of the secondary cell into at least a first component having a smaller time constant and a second component having a larger time constant, and (iii) estimate a voltage value of the second component having the larger time constant;

an open-circuit voltage corrector configured to correct the open-circuit voltage value calculated by the open-circuit voltage calculator with the voltage value of the second component having the larger time constant estimated by the polarization voltage estimator by adding the voltage value of the second component to the open: circuit voltage value during an overdischarge or subtracting the voltage value of the second component from the open: circuit voltage value during an overcharge; and a state-of-charge calculator configured to indicate a state of charge of the secondary cell based on the open-circuit voltage value corrected by the open-circuit voltage corrector.

11. An open-circuit voltage estimation method comprising:
obtaining a measured polarization voltage of a secondary cell;
dividing the polarization voltage of the secondary cell into at least a first component having a smaller time constant and a second component having a larger time constant;
estimating a voltage value of the second component having the larger time constant;
correcting a calculated open-circuit voltage value of the secondary cell with the voltage value of the second component having the larger time constant by adding the voltage value of the second component to the open: circuit voltage value during an overdischarge or subtracting the voltage value of the second component from the open-circuit voltage value during an overcharge; and
indicating a state of charge of the secondary cell based on the corrected open-circuit voltage value.

12. The open-circuit voltage estimation device according to claim 1, wherein the polarization voltage of the secondary cell is measured during a current stop of the secondary cell.

13. The power storage apparatus according to claim 10, wherein the polarization voltage of the secondary cell is measured during a current stop of the secondary cell.

14. The open-circuit voltage estimation method according to claim 11, which includes measuring the polarization voltage of the secondary cell during a current stop of the secondary cell.

* * * * *